(12) United States Patent
Choi et al.

(10) Patent No.: US 11,374,193 B2
(45) Date of Patent: Jun. 28, 2022

(54) DISPLAY DEVICE HAVING SECOND ELECTRODE INCLUDING A FIRST PORTION THAT IS NOT OVERLAPPED WITH THE MODULE HOLE AND A SECOND PORTION BETWEEN THE MODULE HOLE AND THE FIRST PORTION

(71) Applicant: Samsung Display Co., Ltd., Yongin-si (KR)

(72) Inventors: Yunjung Choi, Hwaseong-si (KR); Sangyeol Kim, Hwaseong-si (KR); Sokwon Noh, Suwon-si (KR); HyungSik Kim, Suwon-si (KR); Suhyun Oh, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/929,425

(22) Filed: May 1, 2020

(65) Prior Publication Data
US 2020/0358024 A1   Nov. 12, 2020

(30) Foreign Application Priority Data

May 8, 2019 (KR) .......................... 10-2019-0053958
Oct. 7, 2019 (KR) .......................... 10-2019-0123805

(51) Int. Cl.
*H01L 51/52* (2006.01)
*H01L 27/32* (2006.01)
(Continued)

(52) U.S. Cl.
CPC ........ *H01L 51/5225* (2013.01); *H01L 27/323* (2013.01); *H01L 27/3244* (2013.01);
(Continued)

(58) Field of Classification Search
CPC ............... H01L 51/5225; H01L 27/323; H01L 27/3244; H01L 51/0023; H01L 51/0096; H01L 51/5253
See application file for complete search history.

(56) References Cited

U.S. PATENT DOCUMENTS 7,148,148 B2   12/2006 Mori et al.
2014/0217397 A1*  8/2014 Kwak .................. H01L 27/1218
                                                        257/43

(Continued)

FOREIGN PATENT DOCUMENTS

KR        10-0519835 B1   10/2005
KR     10-2006-0015930 A    2/2006
(Continued)

*Primary Examiner* — Michael Jung
(74) *Attorney, Agent, or Firm* — Lewis Roca Rothgerber Christie LLP

(57) ABSTRACT

A display device according to an embodiment may include a base substrate, a circuit layer, a light emitting element layer, and a module hole. The light emitting element layer may include a first electrode, a light emitting layer, and a second electrode. The second electrode may include a first portion that is not overlapped with the module hole and has a first thickness and a second portion between the module hole and the first portion and having a thickness that gradually increases in a direction toward the first portion. Thus, the display device may improve in durability in a hot and humid environment.

12 Claims, 23 Drawing Sheets

(51) Int. Cl.
*H01L 51/00* (2006.01)
*H01L 51/56* (2006.01)

(52) U.S. Cl.
CPC ...... *H01L 51/0023* (2013.01); *H01L 51/0096* (2013.01); *H01L 51/5253* (2013.01); *H01L 51/56* (2013.01); *H01L 2227/323* (2013.01); *H01L 2251/301* (2013.01)

(56) References Cited

U.S. PATENT DOCUMENTS

| | | | |
|---|---|---|---|
| 2016/0190225 A1* | 6/2016 | Kim | H01L 27/3248 257/40 |
| 2017/0092894 A1* | 3/2017 | Yang | H01L 27/326 |
| 2018/0089485 A1* | 3/2018 | Bok | G06K 9/0002 |
| 2018/0108685 A1* | 4/2018 | Kim | H01L 27/1248 |
| 2019/0245020 A1 | 8/2019 | Choi et al. | |

FOREIGN PATENT DOCUMENTS

| KR | 10-0759376 B1 | 9/2007 |
|---|---|---|
| KR | 10-2017-0066767 A | 6/2017 |

* cited by examiner

DISPLAY DEVICE HAVING SECOND ELECTRODE INCLUDING A FIRST PORTION THAT IS NOT OVERLAPPED WITH THE MODULE HOLE AND A SECOND PORTION BETWEEN THE MODULE HOLE AND THE FIRST PORTION

CROSS-REFERENCE TO RELATED APPLICATIONS

This application claims priority to and the benefit of Korean Patent Application Nos. 10-2019-0053958, filed on May 8, 2019, and 10-2019-0123805, filed on Oct. 7, 2019, the entire contents of both of which are hereby incorporated by reference.

BACKGROUND

1. Field

The present disclosure relates to a display device and a method for manufacturing the same, and more particularly, to a display device having improved durability and a method for manufacturing the same.

2. Description of the Related Art

In recent years, in order to accommodate an electronic module such as a camera in a display device, a technique for defining a hole passing through a display area of a display module has been actively researched. However, when the hole is defined by a physical method, particles are generated from an electrode made of metal to damage a surrounding area, or an electrode is delaminated and easily damaged by heat and moisture.

SUMMARY

One or more example embodiments of the present disclosure provide a display device having substantially higher (e.g., improved) durability.

One or more example embodiments of the present disclosure also provide a method for manufacturing the display device having substantially higher (e.g., improved) durability.

An example embodiment of the present disclosure provides a display device including a display area and a module hole area defined in the display area. The display device includes: a base substrate; a circuit layer on the base substrate; a light emitting element layer on the circuit layer and including a first electrode, a second electrode on the first electrode, and a light emitting layer between the first electrode and the second electrode; an encapsulation layer on the light emitting element layer; and a module hole overlapping the module hole area and passing through the circuit layer and the light emitting element layer. Here, the second electrode includes a first portion that is not overlapped with the module hole and has a first thickness and a second portion between the module hole and the first portion and having a thickness that gradually increases in a direction toward the first portion.

In an example embodiment, the second electrode may include silver (Ag) and magnesium (Mg). Each of the Ag and the Mg may have an amorphous structure and a polycrystalline structure in the second portion. Each of the Ag and the Mg may have a polycrystalline structure in the first portion.

In an example embodiment, the second portion may have a width that gradually increases in a direction toward the circuit layer.

In an example embodiment, a mole ratio between the Ag and the Mg may be about 95:5 to about 85:15 in the first portion.

In an example embodiment, the second electrode may further include at least one of Cu, Al, Pt, Pd, Au, Ni, Nd, Ir, Cr, Li, Ca, LiF/Ca, LiF/Al, Mo, and Ti. The second electrode may be a transflective electrode.

In an example embodiment, the electronic module may be a camera module or an infrared sensing module.

In an example embodiment of the inventive concept, a display device includes a display area and a module hole area defined in the display area. The display device includes: a base substrate; a circuit layer on the base substrate; a light emitting element layer on the circuit layer and including a first electrode, a second electrode on the first electrode, and a light emitting layer between the first electrode and the second electrode; and a module hole overlapping the module hole area and passing through the circuit layer and the light emitting element layer.

In an example embodiment, the second electrode may include Ag and Mg. The second electrode may include a first portion that is not overlapped with the module hole and a second portion between the module hole and the first portion. Each of the Ag and Mg may have a polycrystalline structure in the first portion, and each of the Ag and Mg may have an amorphous structure and a polycrystalline structure in the second portion.

In an example embodiment, the first portion may have a uniform thickness, and the second portion may have a thickness that gradually increases in a direction from the module hole to the first portion.

In an example embodiment, a mole ratio of the Ag of the first portion with respect to the entire first portion may be different from that of the Ag of the second portion with respect to the entire second portion.

In an example embodiment of the inventive concept, a method for manufacturing a display device includes: providing a base substrate including a preliminary module hole area and a display area adjacent to the preliminary module hole area; forming a circuit layer on the base substrate and a light emitting element layer including a first electrode, a light emitting layer, and a second electrode, which are sequentially laminated on the circuit layer; forming an electrode hole overlapping the preliminary module hole area by electrolyzing the second electrode; and forming a module hole passing through the circuit layer and the light emitting element layer.

In an example embodiment, the forming of the electrode hole may include electrolyzing the second electrode by using an electrolysis device. Here, the electrolysis device may include: a probe including a solid electrolyte part and a reduction part; a power supply unit including a negative electrode and a positive electrode; a first connection unit configured to connect the negative electrode to the probe; and a second connection unit configured to connect the positive electrode to the second electrode.

In an example embodiment, the forming of the electrode hole may include: allowing the solid electrolyte part to contact one area of the second electrode, which overlaps the preliminary module hole area; electrically connecting the positive electrode to the second electrode; and applying a current to the second electrode from the power supply unit.

In an example embodiment, the second electrode may include Ag and Mg, and a mole ratio between the Ag and the Mg may be about 95:5 to about 85:15.

In an example embodiment, the forming of the electrode hole may further include heating the solid electrolyte part at a temperature of about 100° C. to about 200° C.

In an example embodiment, the solid electrolyte part may include a solid electrolyte containing Ag.

In an example embodiment, the forming of the module hole may include laser-etching an area overlapping the preliminary module hole area.

In an example embodiment, the solid electrolyte part may have a cylindrical or truncated cone shape.

BRIEF DESCRIPTION OF THE DRAWINGS

The accompanying drawings are included to provide a further understanding of the example embodiments of the inventive concept, and are incorporated in and constitute a part of this specification. The drawings illustrate example embodiments of the inventive concept and, together with the description, serve to explain principles of the inventive concept. In the drawings.

DETAILED DESCRIPTION

Figure 1:
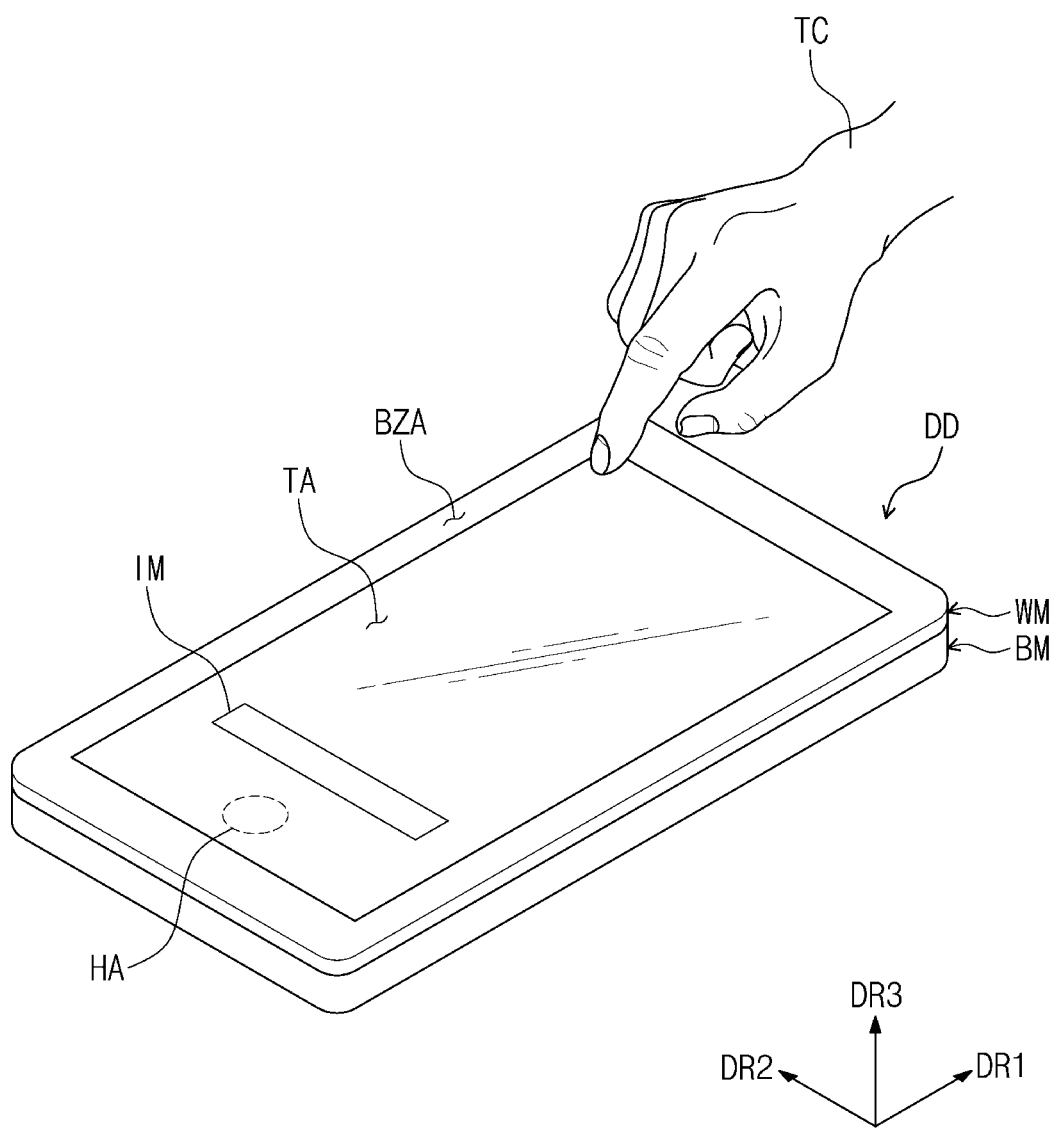
FIG. 1 is a perspective view illustrating a display device according to an example embodiment.

In this specification, it will also be understood that when one component (or region, layer, portion) is referred to as being cony, 'connected to', or 'coupled to' another component, it can be directly connected to or coupled to the one component, or an intervening third component may also be present.

Like reference numerals refer to like elements throughout. Also, in the figures, the thickness, ratio, and dimensions of components are exaggerated for clarity of illustration.

The term "and/or" includes any and all combinations of one or more of the associated listed items.

It will be understood that, although, the terms such as 'first' and 'second' are used herein to describe various elements, these elements should not be limited by these terms. The terms are only used to distinguish one component from other components. For example, a first element referred to as a first element in one embodiment can be referred to as a second element in another embodiment without departing from the scope of the appended claims. The terms of a singular form may include plural forms unless referred to the contrary.

Also, "under", "below", "above", "upper", and the like are used for explaining relation association of components illustrated in the drawings. The terms may be a relative concept and described based on directions expressed in the drawings.

Unless otherwise defined, all terms (including technical and scientific terms) used herein have the same meaning as generally understood by those skilled in the art. Terms as defined in a commonly used dictionary should be construed as having the same meaning as in an associated technical context, and unless defined apparently in the description, the terms are not ideally or excessively construed as having formal meaning.

The meaning of 'include' or 'comprise' specifies a property, a fixed number, a step, an operation, an element, a component or a combination thereof, but does not exclude other properties, fixed numbers, steps, operations, elements, components or combinations thereof.

Hereinafter, embodiments of the inventive concept will be described with reference to the accompanying drawings.

Figure 2:
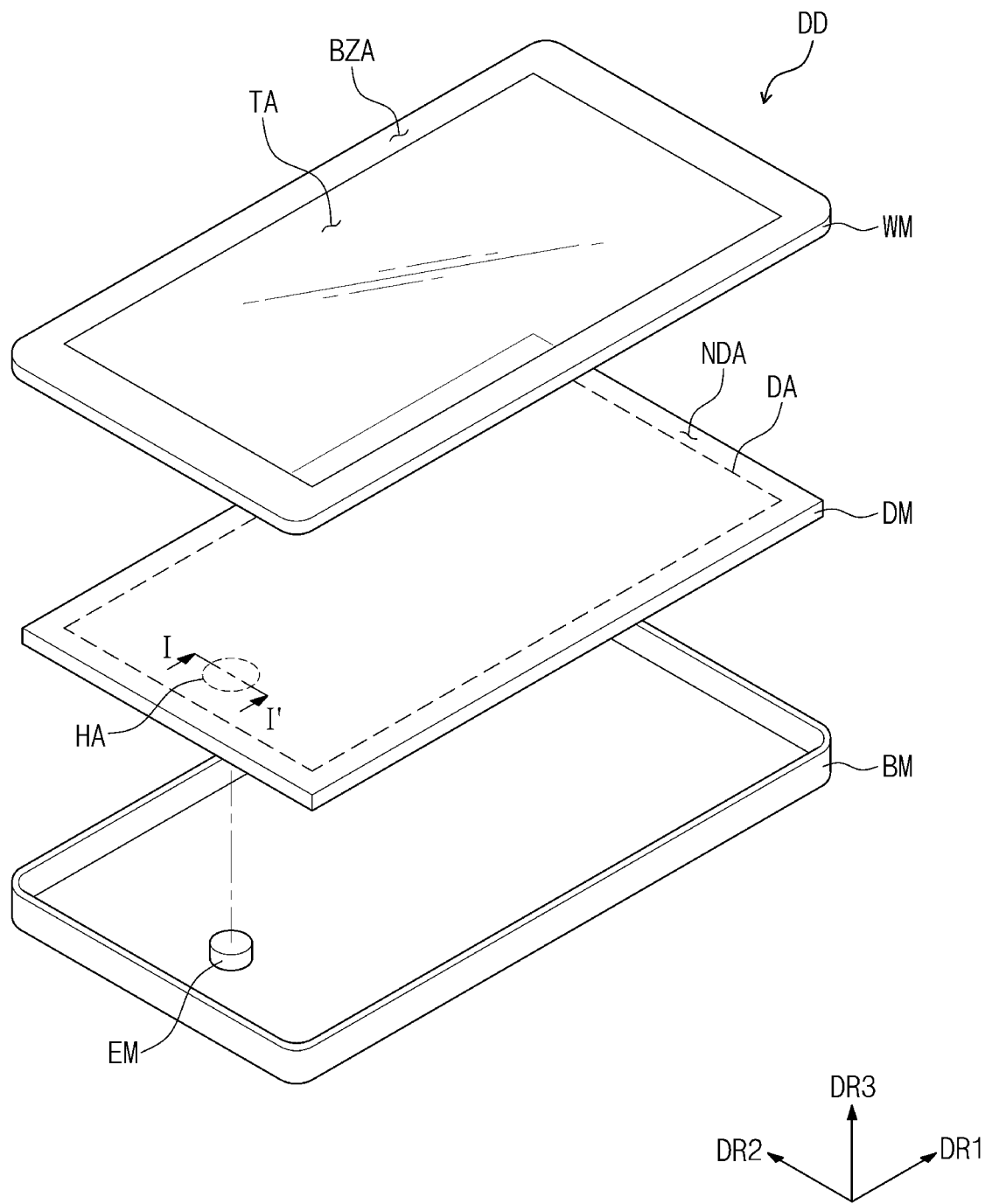
FIG. 2 is an exploded perspective view illustrating the display device according to an example embodiment.
Figure 3A:
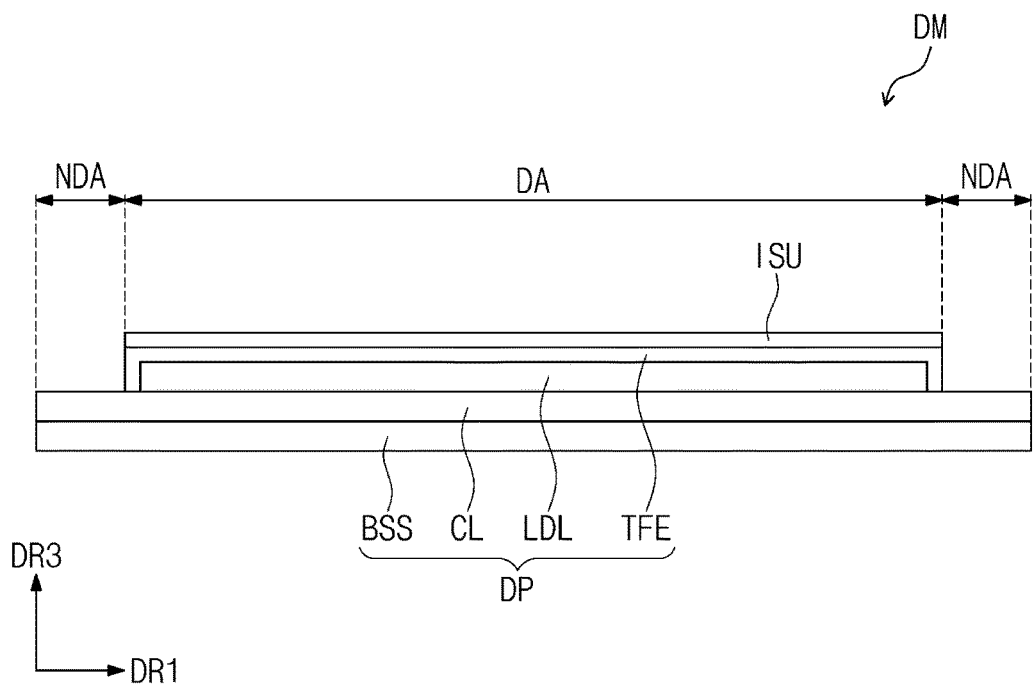
FIGS. 3A and 3B are cross-sectional views each illustrating a display module according to an example embodiment.
Figure 3B:
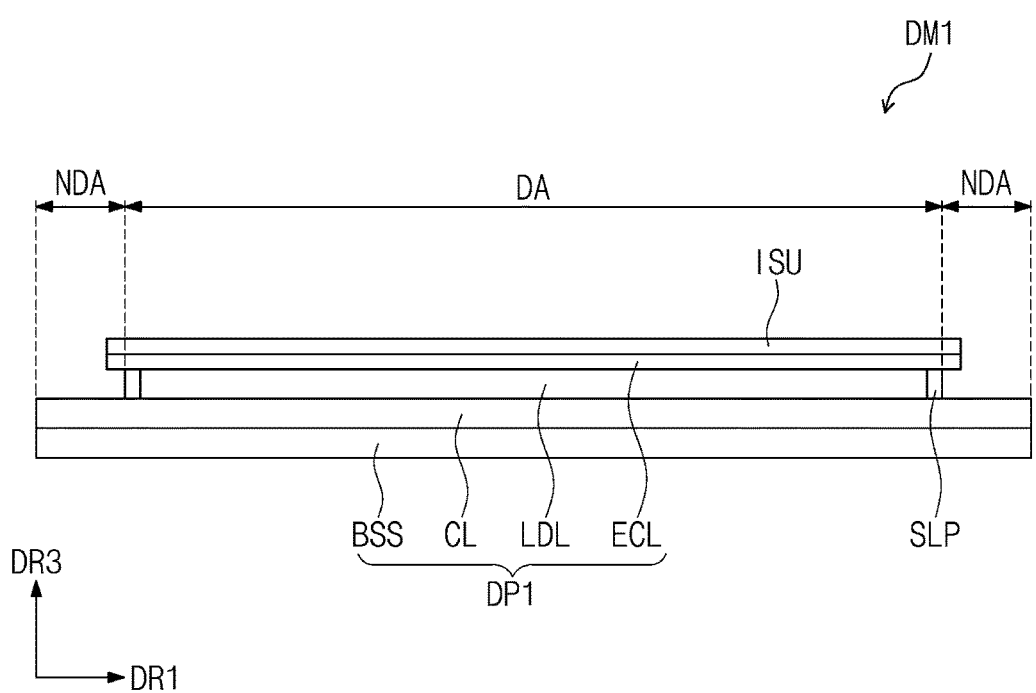

FIG. 1 is a perspective view illustrating a display device DD according to an embodiment. FIG. 2 is an exploded perspective view illustrating the display device DD according to an embodiment. FIGS. 3A and 3B are cross-sectional views each illustrating a display module according to an embodiment.

As illustrated in FIG. 1, the display device DD may display an image IM on a front surface thereof. The front surface may be parallel to a surface defined by a first direction DR1 and a second direction DR2. The front surface includes a transmission area TA and a bezel area BZA adjacent to the transmission area TA.

The image IM may be displayed on the transmission area TA of the display device DD. FIG. 1 illustrates an internet search window as an example of the image IM. The transmission area TA may have a rectangular shape parallel to each of the first direction DR1 and the second direction DR2. However, this is intended to be illustrative. For example, the transmission area TA may have various shapes. The embodiment of the inventive concept is not limited to a specific embodiment.

The bezel area BZA is adjacent to the transmission area TA. The bezel area BZA may surround the transmission area TA. However, the embodiment of the inventive concept is not limited thereto. For example, the bezel area BZA may be adjacent to only one side of the transmission area TA, or omitted.

The display device DD may include various embodiments. For example, the display device DD may include a tablet computer, a notebook computer, a personal computer, and a smart television. In an embodiment, a smartphone is illustrated as an example of the display device DD.

A normal direction may correspond to a thickness direction DR3 (hereinafter, referred to as a third direction) of the display device DD. In this embodiment, a top surface (or front surface) and a bottom surface (or rear surface) of each of members are defined on the basis of a direction in which the image IM is displayed. The top surface and the bottom surface may face each other in the third direction DR3.

However, directions indicated by the first to third directions DR1, DR2, and DR3, as relative concepts, may be converted with respect to each other. Hereinafter, first to third directions may be indicated by the first to third directions DR1, DR2, and DR3 and designated by the same reference numerals, respectively.

The display device DD according to an embodiment of the inventive concept may detect a user's input TC applied from the outside. For example, the user's input TC includes various types of external inputs such as a portion of a user's body, light, heat, or pressure. In the embodiment, a user's finger applied to a front surface is illustrated as an example of the user's input TC. However, this is merely an example. For example, as described above, the user's input TC may be provided in various types, and the display device DD may also detect the user's input TC applied to a side surface or a rear surface of the display device DD according to a structure of the display device DD. However, the embodiment of the inventive concept is not limited thereto.

As illustrated in FIGS. 1 and 2, the display device DD may include a display module DM, a window WM, an electronic module EM, and an accommodation member BM.

The display module DM may display the image IM and detect the external input TC. For example, the display module DM may include a light emitting element LD (refer to FIG. 4) emitting light and an input sensing unit ISU (refer to FIGS. 3A and 3B) detecting an external input.

Referring to FIG. 2, the display module may include a display area DA, a non-display area NDA, and a module hole area HA, which are distinguished on a plane.

In an embodiment, the display area DA may be an area on which the image IM is displayed and which detects the external input TC at the same time. However, this is merely an example. For example, the display area DA may be divided into an area on which the image IM is displayed and an area in which the external input TC is detected.

The non-display area NDA may be an area covered by the bezel area BZA. The non-display area NDA is adjacent to the display area DA. The non-display area NDA may surround the display area DA. In the non-display area NDA, a driving circuit or a driving line for driving the display area DA may be placed.

In the embodiment, the display module DM is assembled in a state in which the display area DA and the non-display area NDA are flat to face the window WM. However, this is merely an example. For example, a portion of the non-display area NDA of the display module DM may be bent. Here, the portion of the non-display area NDA may be bent toward the rear surface of the display device DD, and thus the bezel area BZA may be reduced in terms of the front surface of the display device DD. Alternatively, the display module DM may be assembled in a state in which a portion of the display area DA is also bent. Furthermore, in the display module DM according to an embodiment of the inventive concept, the non-display area NDA may be omitted.

The module hole area HA may have an edge surrounded by the display area DA. On the plane, the module hole area HA may be spaced from the non-display area NDA with at least a portion of the display area DA therebetween.

Figure 4:
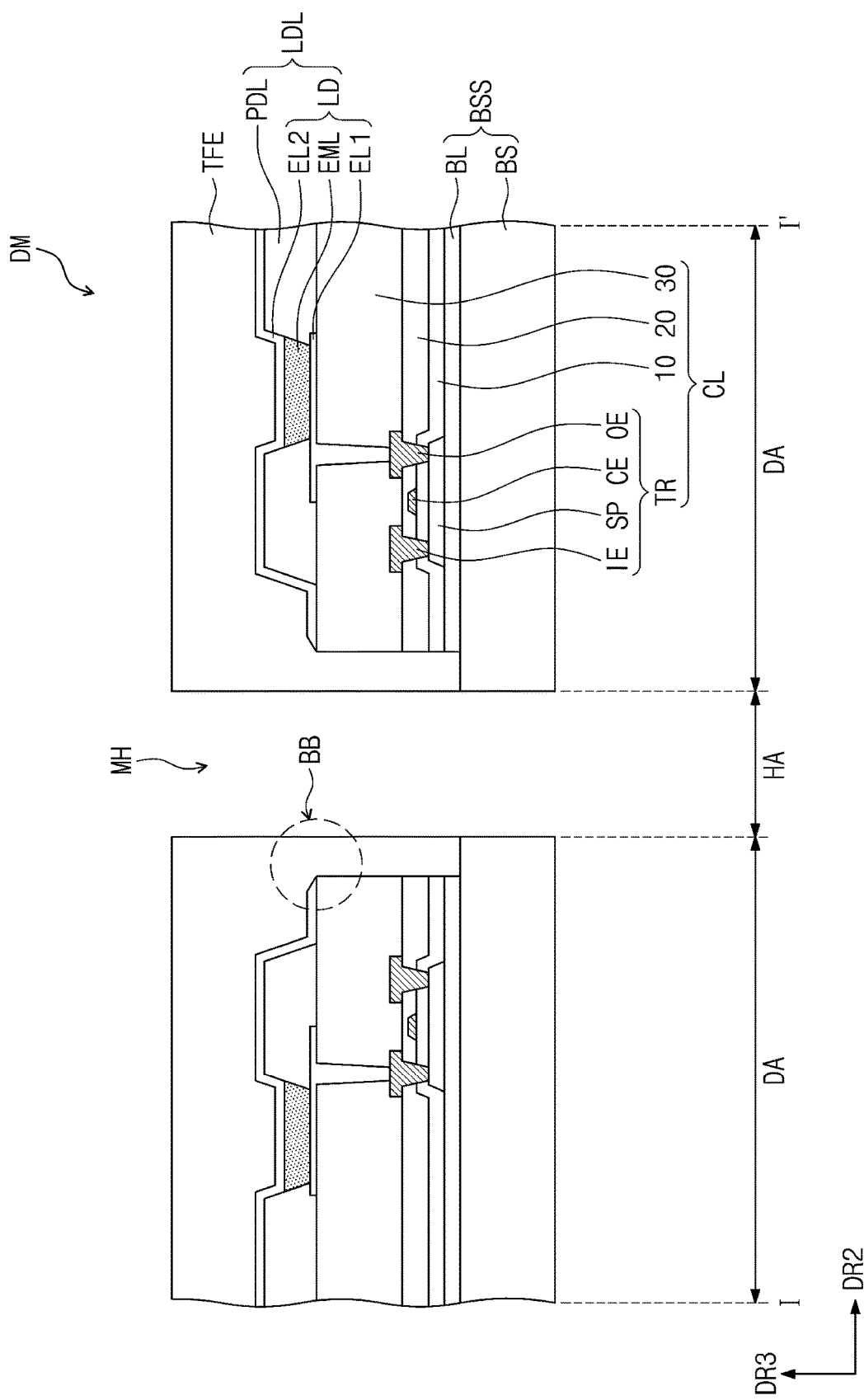
FIG. 4 is a cross-sectional view taken along the line I-I' of FIG. 2.

The module hole area HA may be an area in which a module hole MH (as shown in FIG. 4) is defined. Thus, the module hole MH may be surrounded by the display area DA on which the image IM is displayed on the plane. Detailed features of the module hole MH will be described later.

The window WM may be on a front surface of the display module DM to protect the display module DM. For example, the window WM may include a glass substrate, a sapphire substrate, or a plastic film. Also, the window WM may be a rigid substrate or a flexible substrate.

The window WM may be divided into a transmission area TA and a bezel area BZA. The transmission area TA may transmit incident light. The transmission area TA may have a shape corresponding to the display area DA. For example, the transmission area TA may overlap all or at least a portion of the display area DA. The image IM displayed on the display area DA of the display module DM may be seen from the outside through the transmission area TA.

The bezel area BZA may have a relatively lower light transmittance than that of the transmission area TA. The bezel area BZA defines a shape of the transmission area TA. The bezel area BZA may be adjacent to the transmission area TA to surround the transmission area TA.

The bezel area BZA may have a predetermined (e.g., set) color. The bezel area BZA may cover the non-display area NDA of the display module DM to block the non-display area NDA from being seen from the outside. However, this is merely an example. For example, in the window WM according to an embodiment of the inventive concept, the bezel area BZA may be omitted.

The accommodation member BM may be coupled with the window WM. The accommodation member BM provides the rear surface of the display device DD. The accommodation member BM may be coupled with the window WM to define an inner space.

The accommodation member BM may stably protect components of the display device DD accommodated (or placed) in the inner space of the display device DD from an external impact. In the inner space provided by the accommodation member BM, the display module DM, the electronic module EM, and the like may be accommodated.

Referring to FIG. 3A, the display module DM may include a display panel DP and an input sensing unit ISU. The display panel DP includes a base substrate BSS, a circuit layer CL, a light emitting element layer LDL, and a thin-film encapsulation layer TFE.

Although, the embodiment of the inventive concept is not specifically limited to the display panel DP, the display panel DP may be, e.g., a light emitting display panel. The display panel DP may be an organic light emitting display panel or a quantum dot light emitting display panel. The organic light emitting display panel includes a light emitting layer containing an organic light emitting material. The quantum dot light emitting display panel includes a light emitting layer containing a quantum dot or a quantum rod. Hereinafter, the display panel DP will be described as the organic light emitting display panel.

The base substrate BSS may include a plastic substrate, a glass substrate, or an organic/inorganic composite substrate.

The circuit layer CL may include a plurality of insulation layers, a plurality of conductive layers, and a semiconductor layer. The plurality of conductive layers of the circuit layer CL may constitute signal lines or a control circuit of a pixel.

The light emitting element layer LDL includes a display element such as organic light emitting diodes. However, the embodiment of the inventive concept is not limited thereto. For example, the light emitting element layer LDL may include inorganic light emitting diodes or organic-inorganic hybrid light emitting diodes according to the type of display panel DP.

The thin-film encapsulation layer TFE seals the light emitting element layer LDL. The thin-film encapsulation layer TFE includes at least one insulation layer. The thin-film encapsulation layer TFE according to an embodiment of the inventive concept may include at least one organic encapsulation layer and at least one inorganic encapsulation layer. For example, the thin-film encapsulation layer TFE may have a structure in which a first inorganic encapsulation layer, an organic encapsulation layer, and a second inorganic encapsulation layer are sequentially laminated.

The inorganic encapsulation layer protects the light emitting element layer LDL from moisture/oxygen, and the organic encapsulation layer protects the light emitting element layer LDL from foreign substances such as dust particles. Although, the inorganic encapsulation layer may include a silicon nitride layer, a silicon oxynitride layer, a silicon oxide layer, a titanium oxide layer, or an aluminum oxide layer, the embodiment of the inventive concept is not limited thereto. Although, the organic encapsulation layer may include an acrylic-based organic layer, the embodiment of the inventive concept is not limited thereto.

The input sensing unit ISU may be directly on the thin-film encapsulation layer TFE through a continuous process. However, the embodiment of the inventive concept is not limited thereto. For example, the input sensing unit ISU may be coupled with the thin-film encapsulation layer TFE through an adhesive member. In this case, the input sensing unit ISU may include a base layer and a sensing circuit layer. The sensing circuit layer may include a plurality of insulation layers and a plurality of conductive layers. Referring to FIG. 3B, the display module DM1 may include a display panel DP1 and an input sensing unit ISU. When the display module DM1 in FIG. 3B is compared with the display module DM in FIG. 3A, only a configuration of an encapsulation substrate ECL may be different, and other configurations may be substantially the same as each other. Thus, hereinafter, the encapsulation substrate ECL will be mainly described.

The encapsulation substrate ECL seals a light emitting element layer LDL. The encapsulation substrate ECL may include glass. The encapsulation substrate ECL may have a rigid property (e.g., the encapsulation substrate ECL may be rigid or substantially rigid). The encapsulation substrate ECL protects the light emitting element layer LDL from foreign substances such as moisture, oxygen, and dust particles. The encapsulation substrate ECL may be coupled with a base layer BS (e.g., the base substrate BSS and the circuit layer CL) through a sealing member SLP. The sealing member SLP may include a frit. However, this is merely an example. The embodiment of the inventive concept is not limited to the material of the sealing member SLP.

The input sensing unit ISU may be on the encapsulation substrate ECL. Although, the encapsulation substrate ECL is contained in the display panel DP1 in FIG. 3B, the encapsulation substrate ECL may be contained in the input sensing unit ISU.

Although, the input sensing unit ISU is directly located on the encapsulation substrate ECL through a continuous process as an example in FIG. 3B, the embodiment of the inventive concept is not limited thereto. For example, an adhesive member (not shown) may be provided between the input sensing unit ISU and the encapsulation substrate ECL, and the input sensing unit ISU and the encapsulation substrate ECL may be coupled to each other. Here, the adhesive member may be an organic adhesive layer such as an optically clear adhesive film (OCA), an optically clear resin (OCR), or a pressure sensitive adhesive film (PSA).

In this specification, the encapsulation layer may include the thin-film encapsulation layer TFE and the encapsulation substrate ECL.

FIG. 4 is a cross-sectional view taken along line I-I' of FIG. 2. Referring to FIG. 4, a display module DM according to an embodiment may include a base substrate BSS, a circuit layer CL, a light emitting element layer LDL, and an encapsulation layer TFE.

The base substrate BSS may include a base layer BS and an auxiliary layer BL. The base layer BS may be an insulation substrate. The base layer BS may be provided in a flexible state. For example, the base layer BS may include polyimide (PI). Also, the base layer BS may be provided in a rigid state. For example, the base layer BS may include various materials such as glass and plastic. The plastic substrate may include at least one of an acrylic-based resin, a methacryl-based resin, polyisoprene, a vinyl-based resin, an epoxy-based resin, an urethane-based resin, a cellulose-based resin, a siloxane-based resin, a polyimide-based resin, a polyamide-based resin, and a perylene-based resin.

The auxiliary layer BL may be on the base layer BS. The auxiliary layer BL may be directly on the base layer BS to cover a front surface of the base layer BS. The auxiliary layer BL may include an inorganic material. The auxiliary layer BL may include a barrier layer and/or a buffer layer. Thus, the auxiliary layer BL may prevent oxygen or moisture introduced through the base layer BS from being permeated to the circuit layer CL or the light emitting element layer LDL, and allow the circuit layer CL to be stably located on the base layer BS. For example, by preventing the circuit layer CL or the light emitting element layer LDL from being exposed to oxygen or moisture, the auxiliary layer BL may ensure the stable operation of the circuit layer CL.

The circuit layer CL may be on the base substrate BSS. The circuit layer CL may include a transistor TR and first to third insulation layers 10, 20, and 30 insulating the transistor TR. Each of the first to third insulation layers 10, 20, and 30 may contain an organic material and/or an inorganic material and have a single-layer or laminated structure.

In FIG. 4, the transistor TR is illustrated as an example of a driving transistor. The transistor TR may include a semiconductor pattern SP, a control electrode CE, an input electrode IE, and an output electrode OE. The semiconductor pattern SP may be on the base substrate BSS. The semiconductor pattern SP may contain a semiconductor material. The control electrode CE may be spaced from the semiconductor pattern SP with the first insulation layer 10 therebetween. The control electrode CE may be connected to one electrode of each of a switching transistor (not shown) and a capacitor (not shown).

Each of the input electrode IE and the output electrode OE may be spaced from the control electrode CE with the second insulation layer 20 therebetween. The input electrode IE and the output electrode OE of the transistor TR may pass through the first insulation layer 10 and the second insulation layer 20 and are electrically connected to one side and the other side of the semiconductor pattern SP, respectively.

The third insulation layer 30 may be on the second insulation layer 20 to cover the input electrode IE and the output electrode OE. Alternatively, in the transistor TR, the semiconductor pattern SP may be on the control electrode CE. Also, the semiconductor pattern SP may be on the input electrode IE and the output electrode OE. Also, the input electrode IE and the output electrode OE may be on the same layer as the semiconductor pattern SP and directly connected to the semiconductor pattern SP. Although, the transistor TR according to an embodiment of the inventive concept may have various structures, the embodiment of the inventive concept is not limited thereto.

The light emitting element layer LDL may be on the circuit layer CL. The light emitting element layer LDL may include a light emitting element LD, which may include a first electrode EL1, a light emitting layer EML, and a second electrode EL2. The light emitting element layer LDL also includes a pixel definition layer PDL that defines the pixel region.

The first electrode EL1 has a conductivity. The first electrode EL1 may be made of a metal alloy or a conductive compound. The first electrode EL1 may be an anode. Also, the first electrode EL1 may be a pixel electrode. The first electrode EL1 may be a reflective electrode. The first electrode EL1 may include Ag, Mg, Cu, Al, Pt, Pd, Au, Ni, Nd, Ir, Cr, Li, Ca, LiF/Ca, LiF/Al, Mo, Ti, or a compound or a mixture (e.g., a mixture of Ag and Mg) thereof. The first electrode EL1 may have a thickness of about 1000 Å to about 10000 Å, e.g., about 1000 Å to about 3000 Å.

The light emitting layer EML may be on the first electrode EL1. The light emitting layer EML may have a thickness of about 100 Å to about 1000 Å of a thickness of about 100 Å to about 300 Å. The light emitting layer EML may have a single layer structure made of a single material, a single layer structure made of a plurality of materials, which are different from each other, or a multilayer structure including a plurality of layers made of a plurality of materials, which are different from each other. The light emitting layer EML may include an organic material or a quantum dot as a light emitting material. When the light emitting layer EML includes an organic material, the light emitting layer EML may include anthracene derivatives, pyrene derivatives, fluoranthene derivatives, chrysene derivatives, dihydrobenzoanthracene derivatives, or triphenylene derivatives. When the light emitting layer EML includes a quantum dot, the quantum dot may have a core-shell structure including a core and a shell surrounding the core. The core of the quantum dot may be selected from the group consisting of a Group II-VI compound, a Group III-V compound, a Group IV-VI compound, a Group IV element, a Group IV compound, and a combination thereof.

The second electrode EL2 is on the light emitting layer EML. The second electrode EL2 may be a common electrode or a cathode. The second electrode EL2 may be, e.g., a transflective electrode.

When the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, or a compound or a mixture (e.g., a mixture of Ag and Mg) thereof. Preferably, the second electrode EL2 may include Ag and Mg. For example, the second electrode EL2 may include only Ag and Mg. The second electrode EL2 may have a thickness of about 10 Å to about 200 Å, e.g., about 50 Å to about 100 Å.

Although not shown, a functional layer such as a hole injection layer, a hole transport layer, and an electron blocking layer may be further placed between the first electrode EL1 and the light emitting layer EML, and a functional layer such as a hole blocking layer, an electron transport layer, and an electron injection layer may be further placed between the light emitting layer EML and the second electrode EL2.

An encapsulation layer TFE may be on the second electrode EL2 to cover the second electrode EL2. The encapsulation layer TFE may directly cover the second electrode EL2. The encapsulation layer TFE may include an organic layer containing an organic material and an inorganic layer containing an inorganic material. In an embodiment, a capping layer (not shown) may cover the second electrode EL2.

A module hole MH may pass through the display module DM in the third direction DR3. The module hole MH may be a through-hole connected from a front surface to a rear surface of the display module DM. That is, the module hole MH may pass through the base substrate BSS, the circuit layer CL, the light emitting element layer LDL, and the encapsulation layer TFE. However, the embodiment of the inventive concept is not limited thereto. For example, the module hole MH may not pass through the base substrate BSS.

In an embodiment, when the encapsulation substrate ECL is placed on the second electrode EL2 instead of the thin-film encapsulation layer TFE, the module hole MH may pass through only one of the base substrate BSS and the encapsulation substrate ECL. Also, the module hole MH may pass through all of the base substrate BSS and the encapsulation substrate ECL or may not pass through all of the same. Detailed descriptions will be described later.

A component on the rear surface of the display module DM to overlap the module hole MH may be seen from the front surface of the display module DM through the module hole MH. Although, the module hole MH has a cylindrical shape having a height in the third direction DR3 in the embodiment, the embodiment of the inventive concept is not limited thereto. For example, the module hole MH may have various shapes such as a polygonal cylinder, an elliptic cylinder, and a truncated cone.

The module hole MH may overlap the electronic module EM on a plane. That is, the module hole MH may accommodate the electronic module EM. The electronic module EM receives a signal inputted (or received) through the module hole MH and provides (or transmits) the received signal to the display module DM. The electronic module EM may receive an external input through the module hole MH. The electronic module EM may include an accommodation part having a size accommodated in the module hole MH or a size similar to the module hole MH. The electronic module EM may be a sensing module such as a camera module, a speaker module, or an infrared sensing module. The electronic module EM may detect an external subject received through the module hole MH or provide an acoustic signal such as a voice through the module hole MH.

Although, one module hole MH is illustrated in FIGS. 1, 2, and 4, the embodiment of the inventive concept is not limited thereto. For example, a plurality of module holes MH may be defined in the display module DM.

Figure 5:
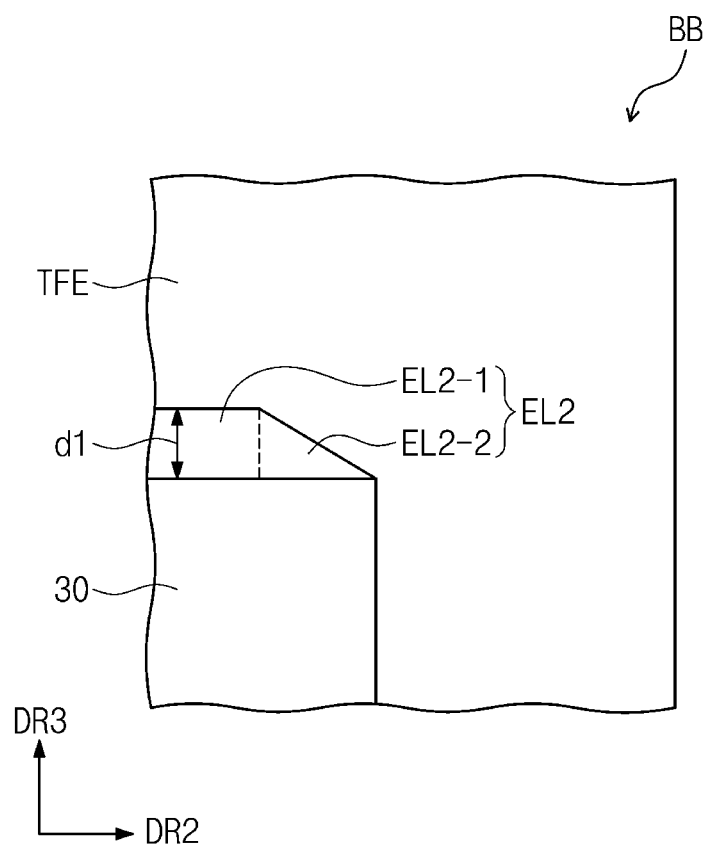
FIG. 5 is an enlarged plan view illustrating an area BB of FIG. 4.

FIG. 5 is an enlarged view illustrating an area BB of FIG. 4.

Referring to FIG. 5, the second electrode EL2 according to an embodiment may include a first portion EL2-1 and a second portion EL2-2. The first portion EL2-1 may not overlap the module hole MH and have a first thickness d1. The first portion EL2-1 may have a uniform thickness. The second portion EL2-2 may be between the module hole MH and the first portion EL2-1.

The second portion EL2-2 may have a thickness that gradually increases in a direction from the module hole MH to the first portion EL2-1. The second portion EL2-2 may extend in a direction from the first portion EL2-1 to the module hole MH. The second portion EL2-2 may have a shape integrated with the first portion EL2-1. The second portion EL2-2 may extend from the first portion EL2-1 along the circuit layer CL. That is, the second portion EL2-2 may extend while contacting the circuit layer CL.

The second portion EL2-2 may have a width that gradually increases in a direction toward the circuit layer CL. Here, the width represents a length in the second direction DR2 perpendicular to the thickness direction DR3 (third direction). For example, as illustrated in FIG. 5, the second portion EL2-2 may have a tapered shape. However, the embodiment of the inventive concept is not limited thereto. For example, the second portion EL2-2 may have a curved shape. Because the second portion EL2-2 according to an embodiment is not delaminated or does not include a burr, the second portion EL2-2 may have a strong durability in a hot and humid environment.

In the first portion EL2-1, each of Ag and Mg may have a polycrystalline structure. In the second portion EL2-2, a portion of each of Ag and Mg may have an amorphous structure, and the rest may have a polycrystalline structure.

The Ag of the first portion EL2-1 with respect to the entire first portion EL2-1 may have a mole ratio different from that of the Ag of the second portion EL2-2 with respect to the entire second portion EL2-2. In the first portion EL2-1, a mole ratio between the Ag and the Mg may be about 95:5 to about 85:15.

Hereinafter, a method S1 for manufacturing the display device DD according to an embodiment will be described in detail with reference to FIGS. 6-11. Hereinafter, in describing FIGS. 6-11, the same components as those described with reference to FIGS. 1-5 will be described in the same manner as the descriptions in FIGS. 1-5 when particular comments are not provided, and thus detailed description will be omitted.

Figure 6:
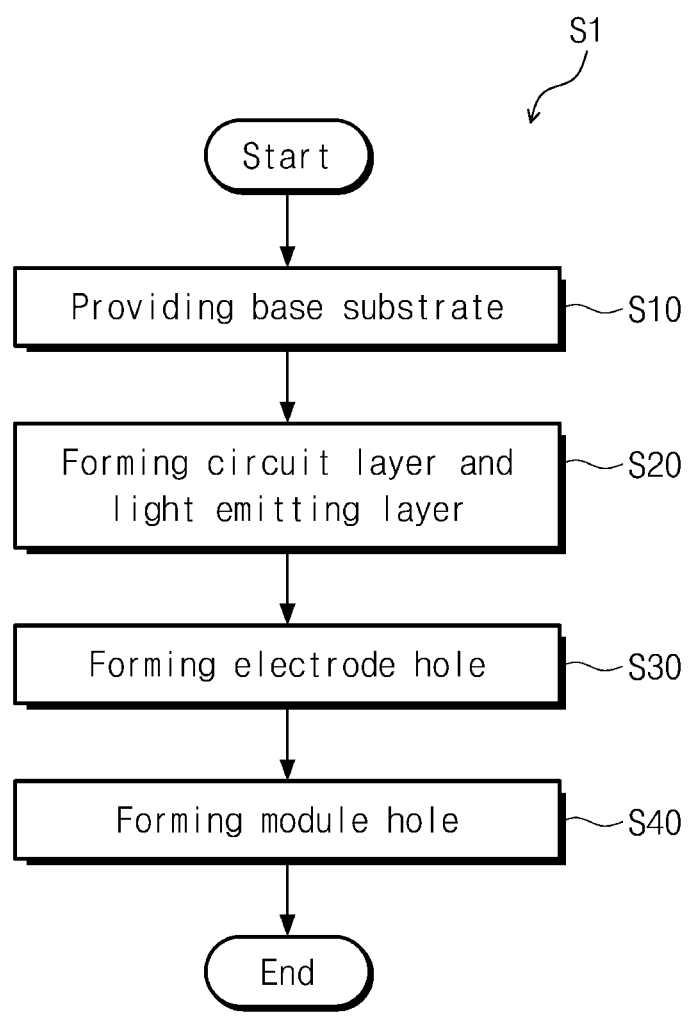
FIG. 6 is a flowchart representing a method of manufacturing the display device according to an example embodiment.
Figure 7:
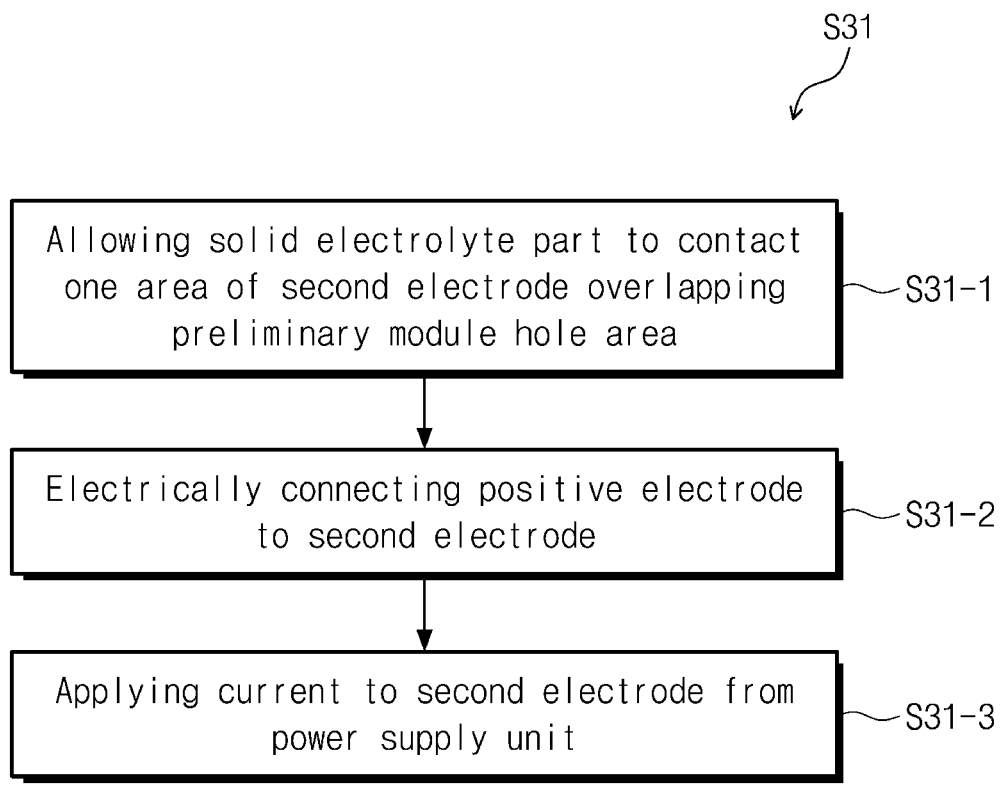
FIG. 7 is a flowchart representing a process of electrolyzing a second electrode by using an electrolysis device according to an example embodiment.
Figure 8A:
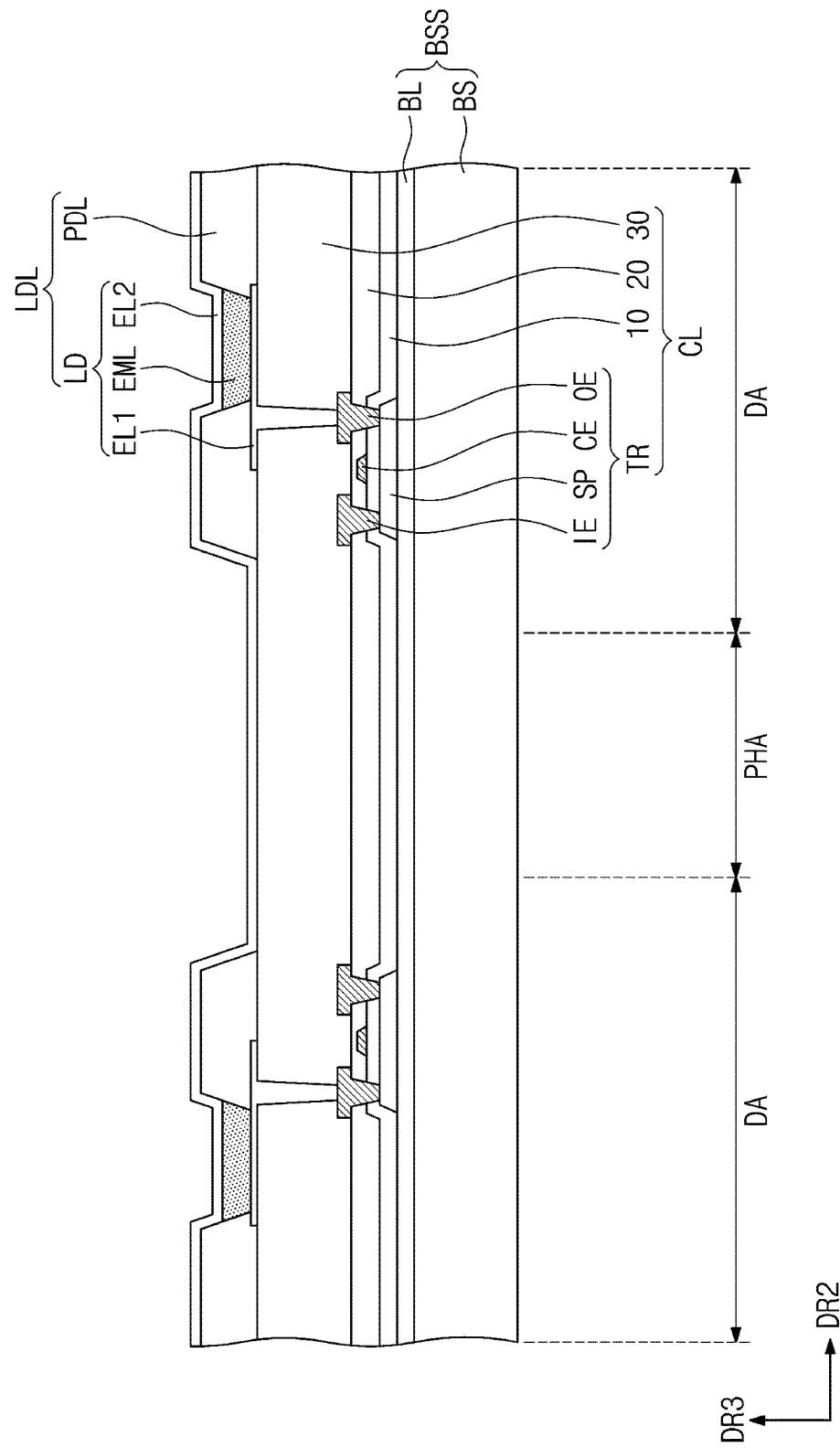
FIGS. 8A-8H are cross-sectional views each illustrating a process or a method of manufacturing a display device according to an example embodiment.
Figure 8B:
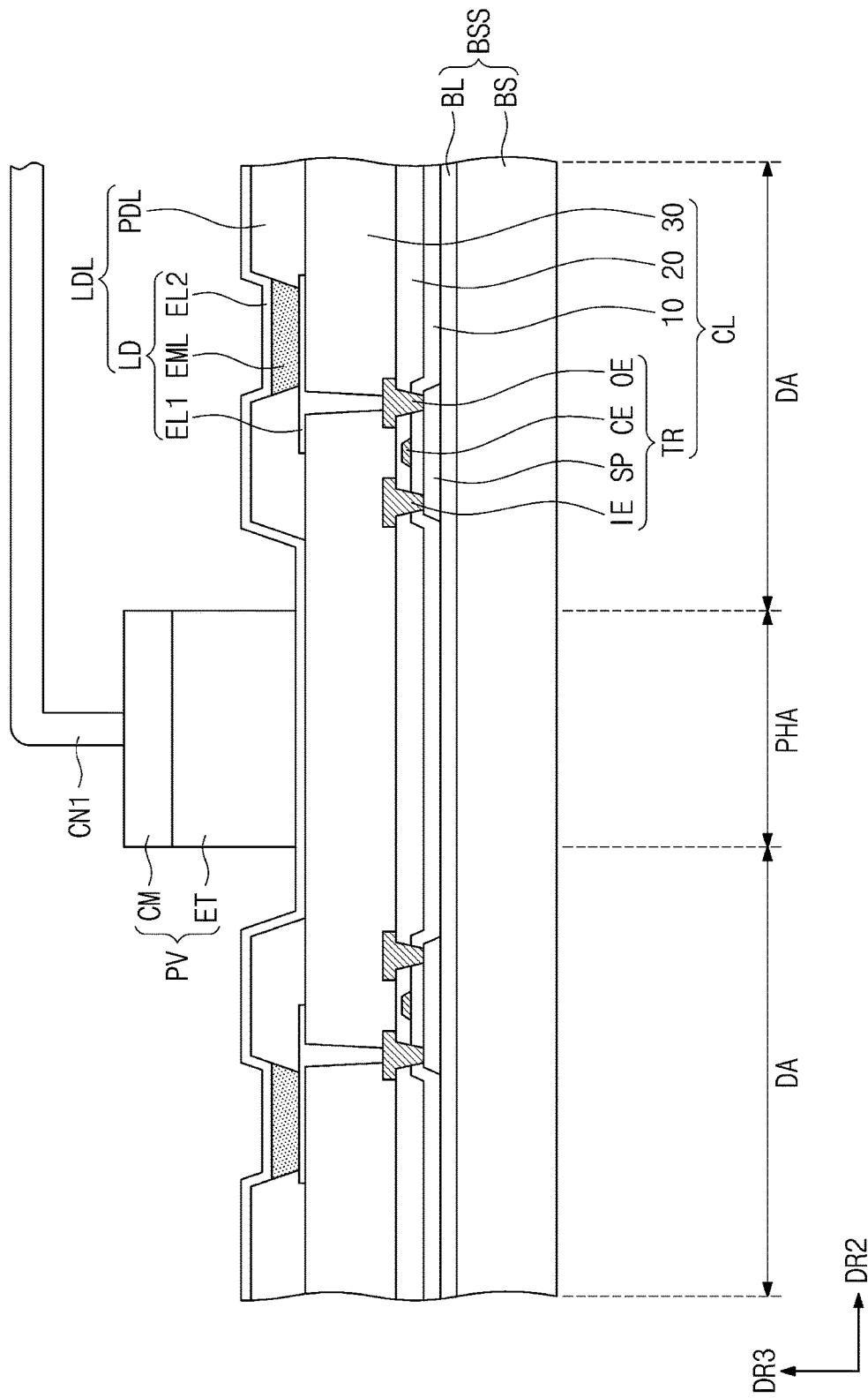

FIG. 6 is a flowchart representing the method S1 of manufacturing the display device according to an embodiment. FIG. 7 is a flowchart representing a process S31 of electrolyzing the second electrode by using an electrolysis device. FIGS. 8A-8H are cross-sectional views illustrating each of processes of the method S1 for manufacturing a display device according to an embodiment. FIGS. 9A-9E are cross-sectional views illustrating each of processes of the method S1 for manufacturing a display device according to an embodiment. FIGS. 8A-8B exemplarily illustrate an embodiment when a display panel DP includes a thin-film encapsulation layer TFE, and FIGS. 9A-9E exemplarily illustrate an embodiment when a display panel DP includes an encapsulation layer ECL.

Referring to FIG. 6, the method S1 for manufacturing the display device according to an embodiment may include a process S10 of providing a base substrate BSS, a process S20 of forming a circuit layer CL and a light emitting element layer LDL, a process S30 of forming an electrode hole EL2-H, and a process S40 of forming a module hole MH.

Referring to FIGS. 6 and 8A, the process S10 of providing a base substrate BSS may provide a base substrate BSS including a preliminary module hole area PHA and a display area DA adjacent to the preliminary module hole area PHA. The process S20 of forming a circuit layer CL and a light emitting element layer LDL may form a circuit layer CL on the base substrate BSS and a light emitting element layer LDL including a first electrode EL1, a light emitting layer EML, and a second electrode EL2, which are placed and sequentially laminated on the circuit layer CL.

Referring to FIGS. 7 and 8B-8D, the process S30 of forming an electrode hole EL2-H may include a process S31 of electrolyzing the second electrode EL2 by using an electrolysis device ELD.

Figure 8C:
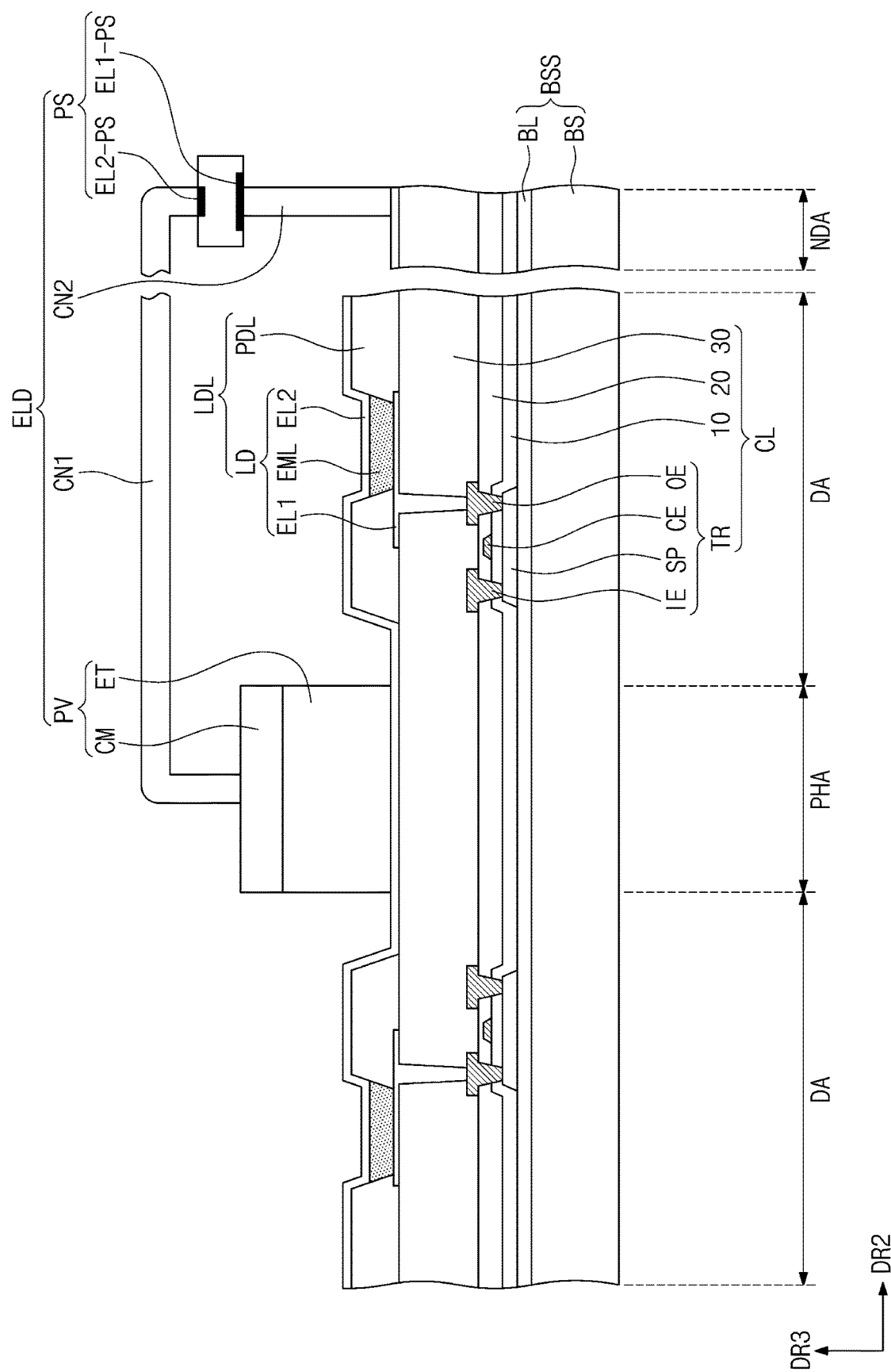

Referring to FIG. 8C, an electrolysis device ELD may include a probe PV, a power supply unit PS, a first connection unit CN1, and a second connection unit CN2. The probe PV may include a solid electrolyte part ET and a reduction part CM. The power supply unit PS may include a negative electrode EL2-PS and a positive electrode EL1-PS. The first connection unit CN1 may connect the power supply unit PS with the probe PV. Particularly, the first connection unit CN1 may connect the negative electrode EL2-PS of the power supply unit PS and the reduction part CM of the probe PV. Although not shown, the first connection unit CN1 may include a first signal line (not shown) connecting the negative electrode EL2-PS of the power supply unit PS and the reduction part CM of the probe PV. The second connection unit CN2 may connect the power supply unit PS and the second electrode EL2. In more detail, the second connection unit CN2 may connect the positive electrode EL1-PS of the power supply unit PS to the second electrode EL2. Although not shown, the second connection unit CN2 may include a second signal line (not shown) connecting the positive electrode EL1-PS of the power supply unit PS and the reduction part CM of the probe PV. In FIG. 8C, the second connection unit CN2 contacts a portion of the second electrode EL2, which overlaps a non-display area NDA, and electrically connects the second electrode EL2 and the power supply unit PS. However, the embodiment of the inventive concept is not limited thereto. The embodiment of the inventive concept is not particularly limited to the position at which the second connection unit CN2 contacts the second electrode EL2.

Referring to FIG. 7, the process S31 of electrolyzing the second electrode EL2 by using an electrolysis device ELD may include a process S31-1 of allowing a solid electrolyte part ET to contact one area of the second electrode EL2, which overlaps a preliminary module hole area PHA, a process S31-2 of electrically connecting the positive electrode EL1-PS to the second electrode EL2, and a process S31-3 of applying a current from the power supply unit PS to the second electrode EL2.

In FIG. 8A, a laminated relationship between the base substrate BSS, the circuit layer CL, and the light emitting element layer LDL, which are provided by the process S10 of providing a base substrate BSS and the process S20 of forming a circuit layer CL and a light emitting element layer LDL is illustrated. Referring to FIG. 8A, the transistor TR, the first electrode EL1, and the light emitting layer EML are not on an area overlapping the preliminary module hole area PHA. However, the embodiment of the inventive concept is not limited thereto. The transistor TR, the first electrode EL1, and the light emitting layer EML may be on the area.

Figure 8D:
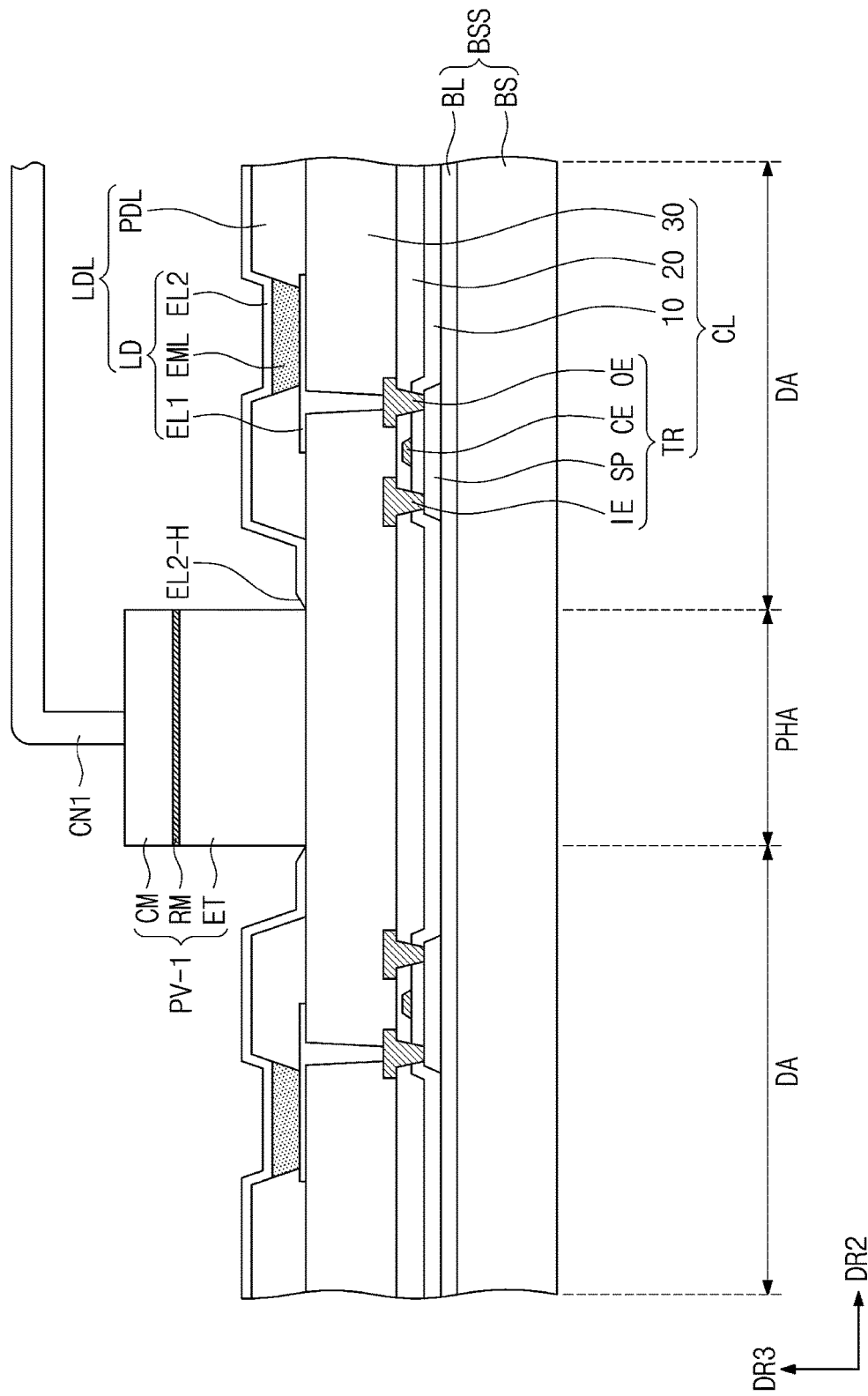

In FIGS. 8B and 8D, the process S31-1 of allowing a solid electrolyte part ET to contact one area of the second electrode EL2, which overlaps a preliminary module hole area PHA, the process S31-2 of electrically connecting the positive electrode EL1-PS to the second electrode EL2, and the process S31-3 of applying a current from the power supply unit PS to the second electrode EL2 are illustrated. Referring to FIGS. 8B-8D, when the solid electrolyte part ET may contact one area of the second electrode EL2, which overlaps the preliminary module hole area PHA, the positive electrode EL1-PS of the power supply unit PS is electrically connected to the second electrode EL2, and then a current is applied from the power supply unit PS, an electrode hole EL2-H may be formed. Particularly, the Ag and the Mg in the second electrode EL2 may be oxidized to form positive ions $Ag^+$ and $Mg^{2+}$, and the formed positive ions $Ag^+$ and $Mg^{2+}$ may move to the reduction part CM along the solid electrolyte. Here, the $Ag^+$ having a strong reduction force may be reduced by receiving an electron from the reduction part CM and form reduction metal RM. In FIG. 8D, a probe PV-1 includes the reduction part CM, the reduction metal RM, and the solid electrolyte part ET.

The embodiment of the inventive concept is not particularly limited to the solid electrolyte containable in the solid electrolyte part ET. However, the solid electrolyte part ET may include the solid electrolyte containing Ag. For example, the solid electrolyte part ET may include at least one of $AgCl$, $AgBr$, $AgI$, $Ag_2S$, $Ag_2CO_3$, and $Ag_2SO_4$ that are not easily dissolved in water and thus easy to maintain a solid shape.

When the solid electrolyte part ET include the electrolyte containing Ag as the solid electrolyte, a speed of electrolysis of the second electrode EL2 containing a large amount of Ag may improve (or increase). During a process of ionization of Ag, the solid electrolyte part ET has to be electrically neutral. In order to achieve the electrical neutrality of the solid electrolyte part ET, whenever Ag is ionized to $Ag^+$, the same number of positive ions may be reduced to the reduction part CM. Here, when a metal ion having a reduction force less than that of the Ag is contained in the solid electrolyte part ET, because a speed of reduction to the reduction part CM is slow, a speed of electrolysis and ionization of the Ag may be slow.

When the solid electrolyte part ET according to an embodiment contains Ag, the electrolysis of the Ag of the second electrode EL2 may be rapidly performed because of high speed of reduction of $Ag^+$ in the reduction part CM. In case of metal having a standard reduction potential greater than the Ag, the metal may not be appropriate to be used as the solid electrolyte due to an increased process cost.

When the second electrode EL2 is removed by using a laser etching method unlike the embodiment of the inventive concept, the display device DD may be damaged by particles generated during removal of the second electrode EL2, or delamination of the second electrode EL2 may occur. For example, the second electrode EL2 may be torn and removed by a laser beam, and thus the delamination (e.g., occurrence of burr) of the second electrode EL2 may occur. For example, the second electrode may have a reverse tapered shape, or a laser contact portion of the second electrode EL2 may be torn apart and easily delaminated. Thus, the display device DD may be easily damaged and degraded in durability in a hot and humid environment.

Because the method S1 for manufacturing the display device DD according to an embodiment remove the second electrode EL2 in an electrolysis method, particles are not generated when the second electrode EL2 is removed in a process of forming the electrode hole EL2-H. Thus, the display device DD may be prevented from being damaged due to the generation of particles. Also, the delamination of the second electrode EL2 may be prevented. For example, a cross-section of the second electrode EL2, which is formed by removal through the electrolysis method, may have a smooth straight line or curved line shape. Specifically, as illustrated in FIG. 5, in the cross-section of the second electrode EL2, the second portion EL2-2 may have the tapered shape. Thus, the display device DD manufactured by the method S1 for manufacturing the display device according to an embodiment may have improved durability.

Referring to FIG. 8D, when the second electrode EL2 is electrolyzed by the method S1 for manufacturing the display device DD according to an embodiment, the second electrode EL2 may include the first portion EL2-1 and the second portion EL2-2 (refer to FIG. 5). During the electrolysis process, as each of a portion contacting the solid electrolyte part ET and a portion adjacent to the solid electrolyte part ET is affected by the electrolysis, a polycrystalline structure of each of the portions may be broken, and each of the portions may have an amorphous structure. For example, because the second portion EL2-2 (refer to FIG. 5) may be adjacent to the solid electrolyte part ET during a manufacturing process, the polycrystalline structure thereof may be broken, and each of the portions may have an amorphous structure. That is, a portion of the second portion EL2-2 (refer to FIG. 5), in which electrolysis is not generated, may maintain a polycrystalline structure, and a portion which is affected by electrolysis and in which electrolysis is generated (i.e., although, electrolysis is performed, the portion is not completely electrolyzed) may have an amorphous structure. Also, the first portion EL2-1 (refer to FIG. 5) which is sufficiently spaced from the solid electrolyte part ET and in which electrolysis is not generated may maintain the polycrystalline structure.

The second portion EL2-2 affected by electrolysis may have a ratio between Ag and Mg, which is different from that of the second electrode EL2 before the electrolysis. Because the first portion EL2-1 is not affected by the electrolysis, the first portion EL2-1 may have the same ratio between Ag and Mg as that of the second electrode EL2 before the electrolysis. Thus, a mole ratio of the Ag of the first portion EL2-1 with respect to the entire first portion EL2-1 may be different from that of the Ag of the second portion EL2-2 with respect to the entire second portion EL2-2. For example, because Mg having a faster reactivity is electrolyzed faster than Ag in the electrolysis process, the mole ratio of the Ag of the second portion EL2-2 may be greater than that of the Ag of the first portion EL2-1.

Referring to FIGS. 6 and 8E-8G, the process S40 of forming the module hole may include a process S40 of passing through the circuit layer CL and the light emitting layer LDL.

Figure 8E:
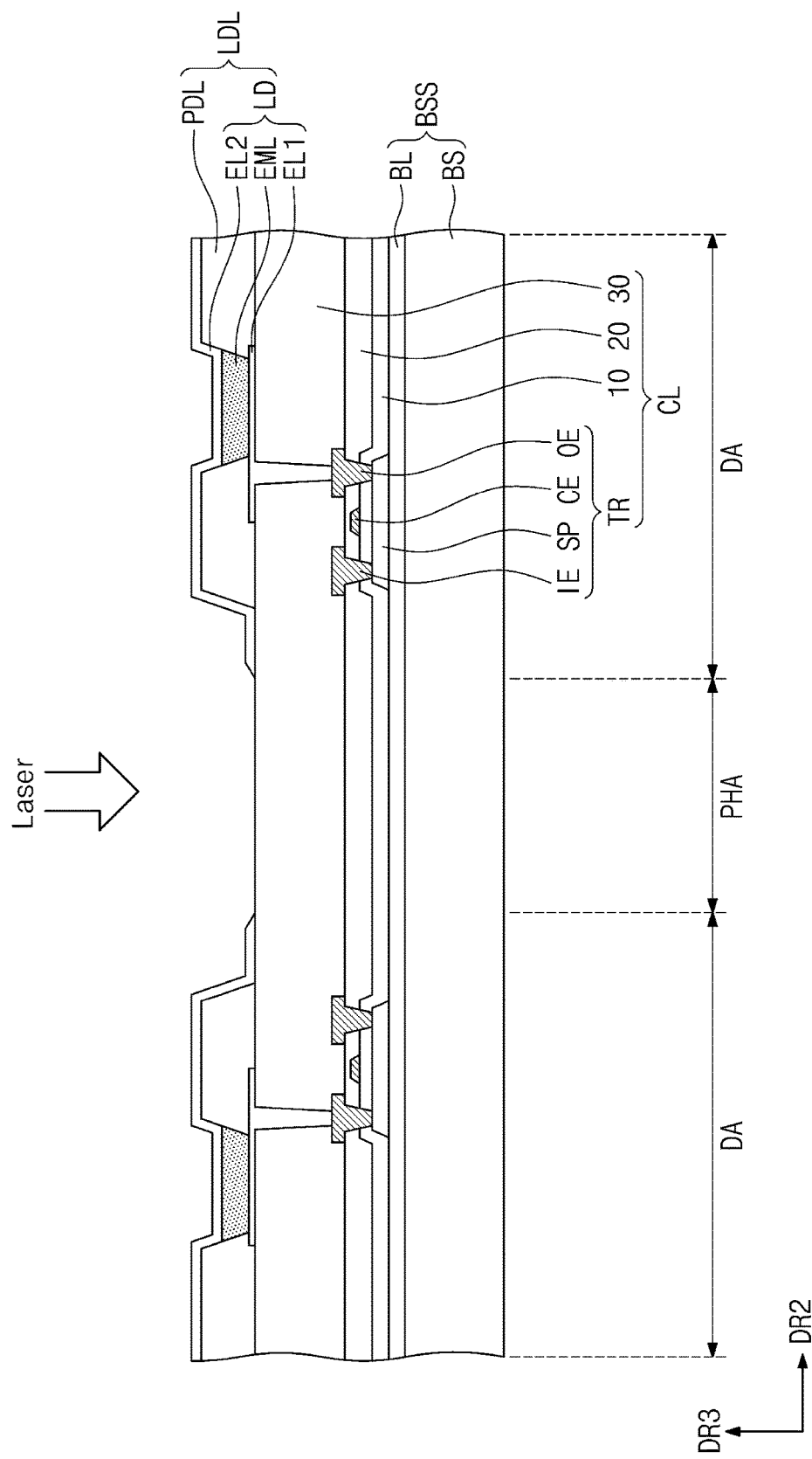
Figure 8F:
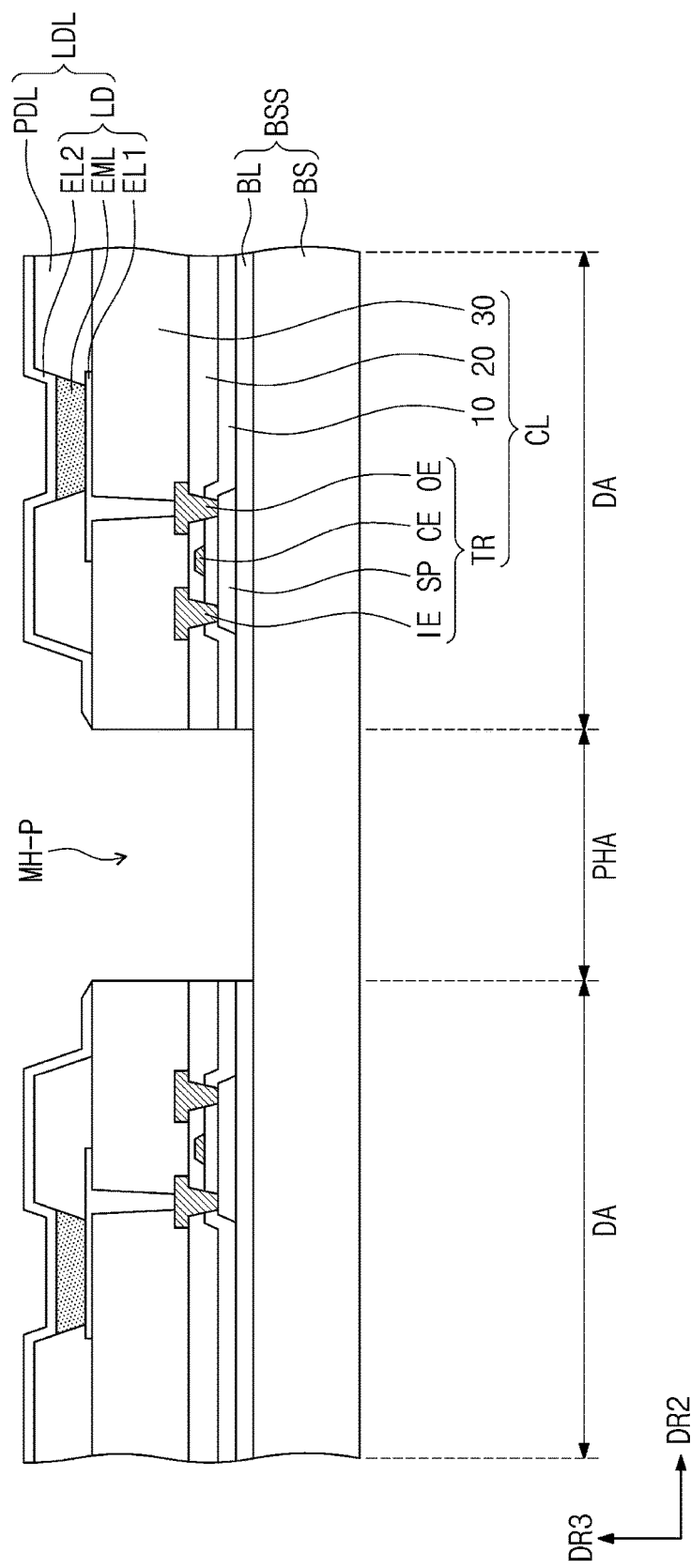

In FIGS. 8E and 8F, a process S40 of forming a preliminary module hole MH-P by laser-etching an area overlapping the preliminary module hole area PHA is illustrated. Referring to FIGS. 8E and 8F, the process S40 of forming the preliminary module hole MH-P may be a process of laser-etching the area overlapping the preliminary module hole area PHA. As a laser is irradiated to the area overlapping the preliminary module hole area PHA, the light emitting element layer LDL, the circuit layer CL, and the auxiliary layer BL may be perforated. Thus, a preliminary module hole MH-P passing through the light emitting element layer LDL, the circuit layer CL, and the auxiliary layer BL may be defined.

Figure 8G:
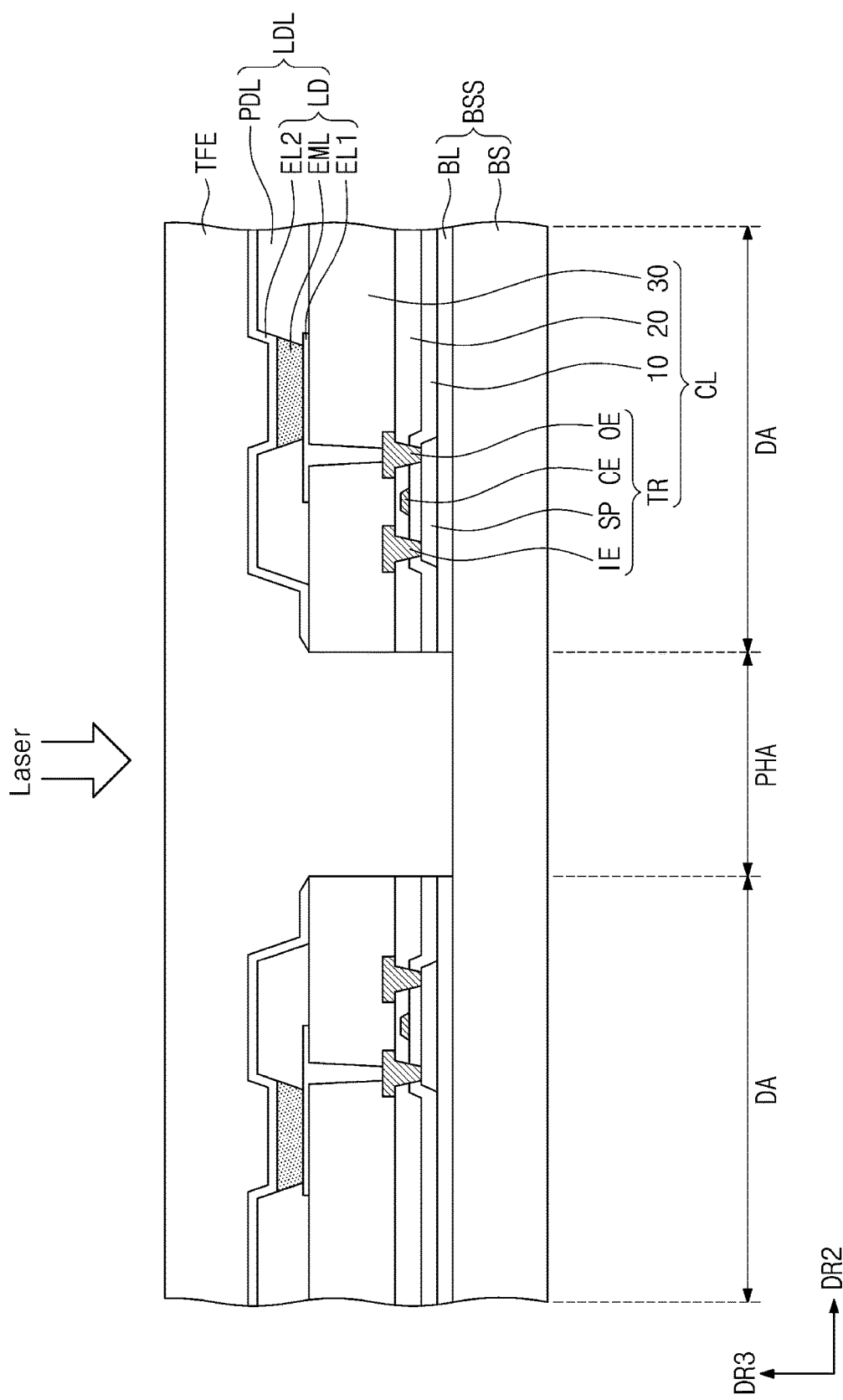
Figure 8H:
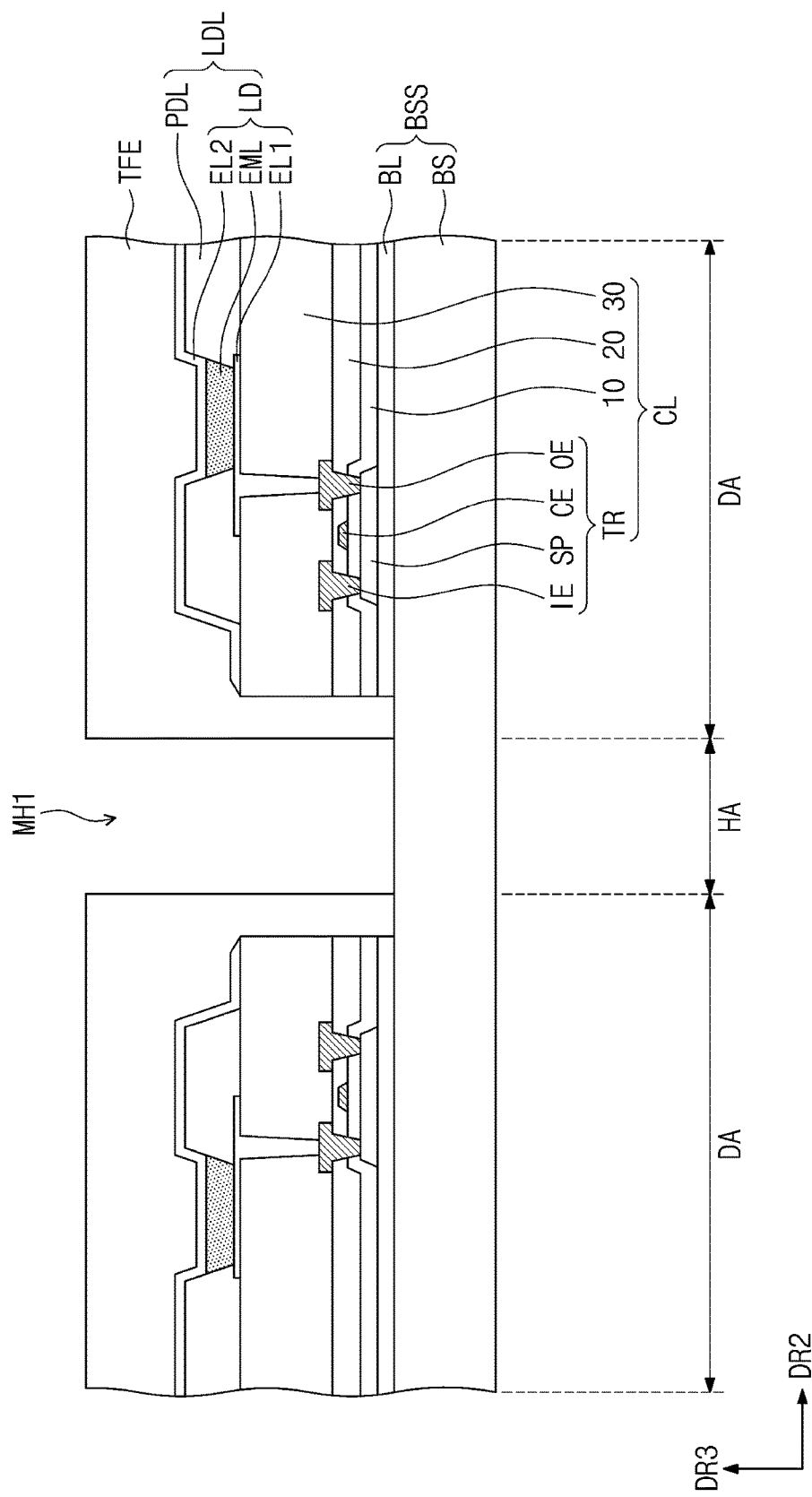

In FIG. 8G, a process of forming a thin-film encapsulation layer TFE is illustrated. In FIG. 8H, a process of forming a module hole MH1 by laser-etching the area overlapping the preliminary module hole area PHA is illustrated.

Referring to FIG. 8G, the thin-film encapsulation layer TFE may be after the preliminary module hole MH-P is defined. As described above, the thin-film encapsulation layer TFE may have a multilayer structure including an organic layer and an inorganic layer, and the organic layer and the inorganic layer may be alternately laminated in the multilayer structure.

Referring to FIG. 8H, as a laser is irradiated to an area overlapping the module hole area HA, the thin-film encapsulation layer TFE may be perforated. Thus, a module hole MH1 passing through the thin-film encapsulation layer TFE, light emitting element layer LDL, the circuit layer CL, and the auxiliary layer BL may be defined in the display panel DP.

The module hole area HA may have an area narrower than the preliminary module hole area PHA. The module hole area HA may be surrounded by the preliminary module hole area PHA. Thus, although, the thin-film encapsulation layer TFE is removed by irradiating the module hole area HA with a laser, the module hole area HA may be covered by the circuit layer CL and the light emitting element layer LDL.

Although not shown, as a laser is irradiated to the area overlapping the module hole area HA, the base layer BS may be further perforated. Thus, the module hole MH (refer to FIG. 4) passing through the thin-film encapsulation layer TFE, the light emitting element layer LDL, the circuit layer CL, and the base substrate BSS may be defined in the display panel DP.

Hereinafter, a method S1 for manufacturing the display device according to an embodiment will be described with reference to FIGS. 9A-9E.

Figure 9A:
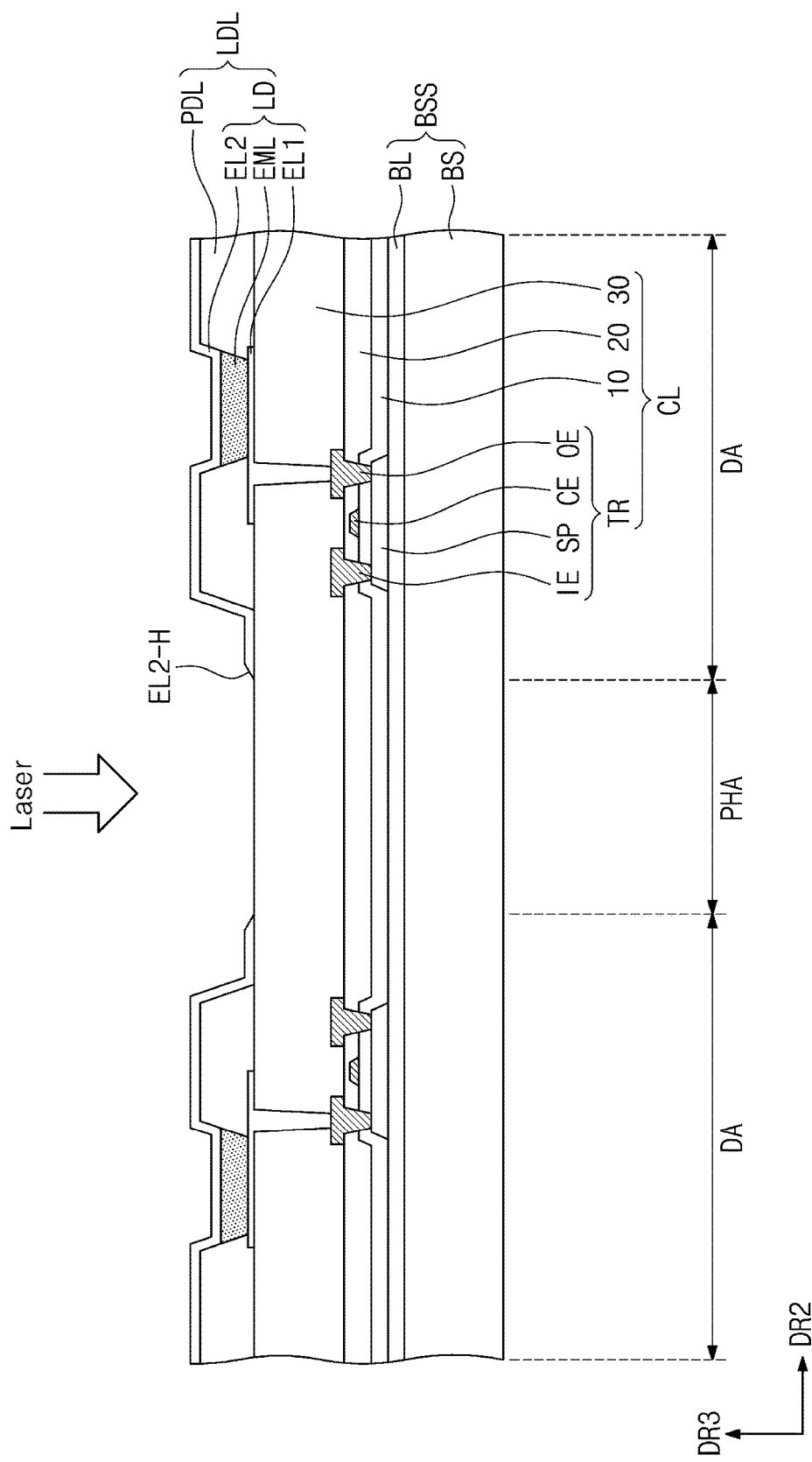
FIGS. 9A-9E are cross-sectional views each illustrating a process or a method of manufacturing a display device according to an example embodiment.
Figure 9B:
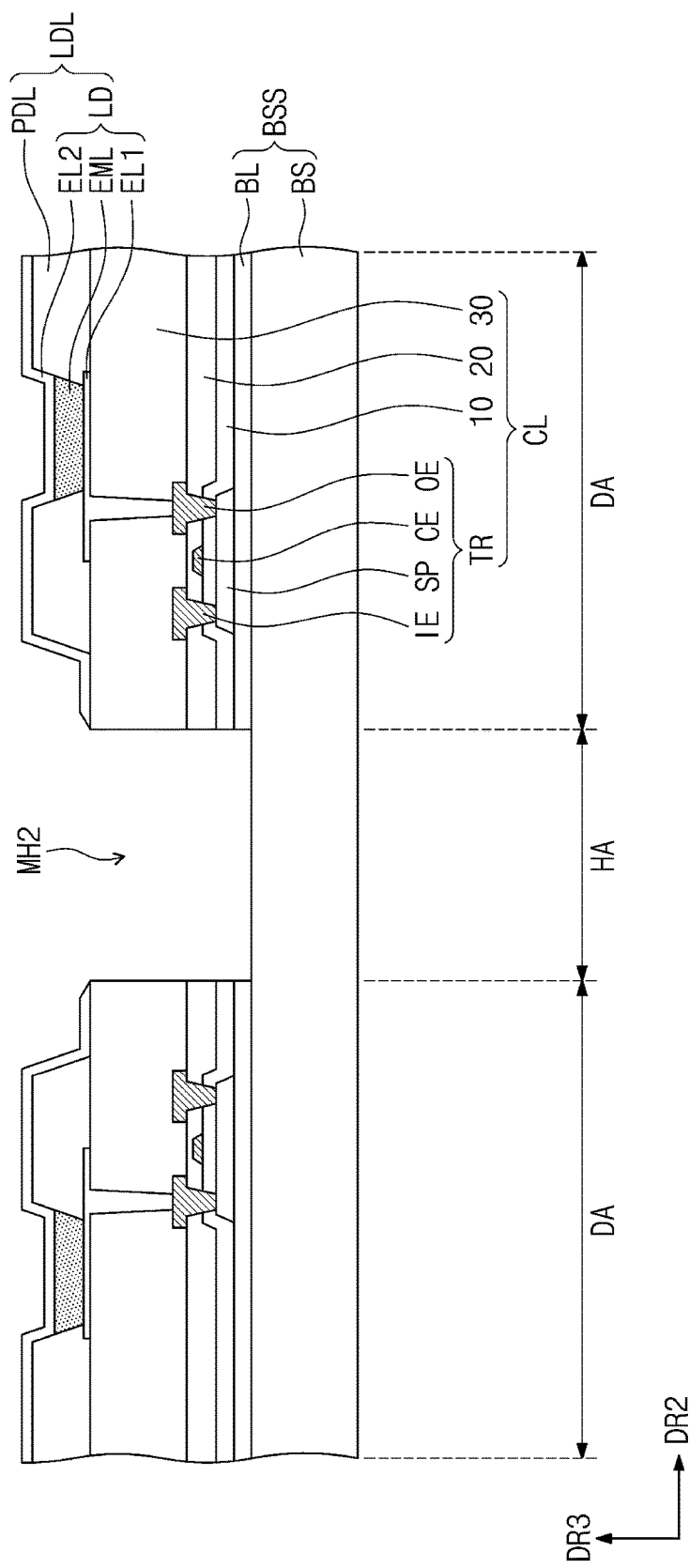

Referring to FIGS. 9A and 9B, an electrode hole EL2-H may be formed in the same method as that described with reference to FIGS. 8A-8E. Hereinafter, a module hole MH2 may be formed in the same method as that described with reference to FIGS. 8E-8F.

Figure 9C:
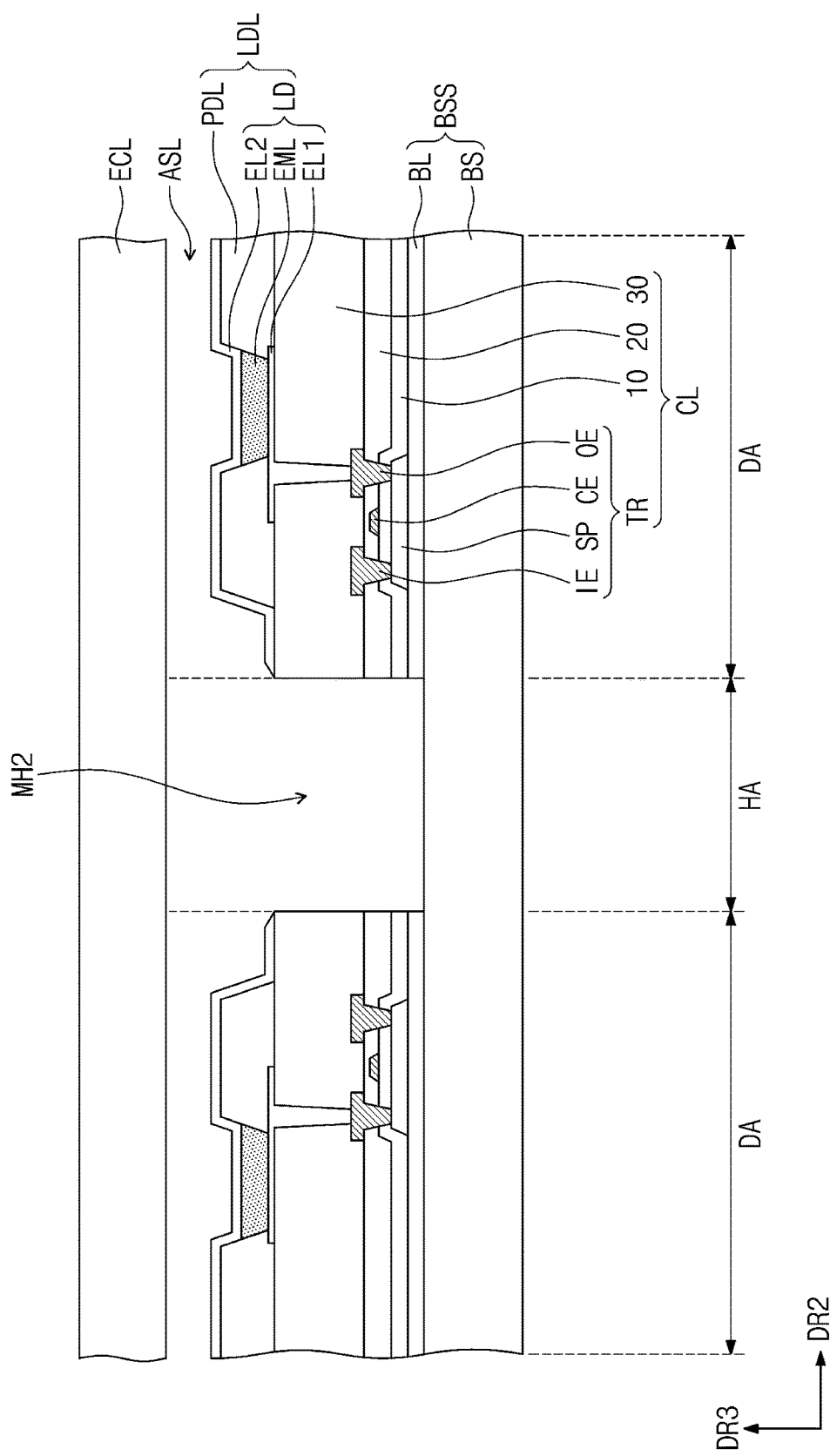

Thereafter, referring to FIG. 9C, an encapsulation substrate ECL may be on a light emitting element layer LDL. As described above, the encapsulation substrate ECL may include glass. The encapsulation substrate ECL may have a rigid property. The encapsulation substrate ECL protects the light emitting element layer LDL from foreign substances such as moisture, oxygen, and dust particles.

A filling layer ASL may be placed between the encapsulation substrate ECL and the light emitting element layer LDL. The filling layer ASL may be defined as a space between the encapsulation substrate ECL and the light emitting element layer LDL. The filling layer ASL may include an inert gas. The filling layer ASL may prevent foreign substances existing between the base substrate BSS and the encapsulation substrate ECL from being spreading. The module hole MH2 may be also filled with an inter gas. Referring to FIG. 9C, the module hole MH2 may be defined as a portion that is not overlapped with the light emitting element layer LDL and the circuit layer CL. The filling layer ASL may be defined as a portion overlapping the light emitting element layer LDL and the circuit layer CL.

Figure 9D:
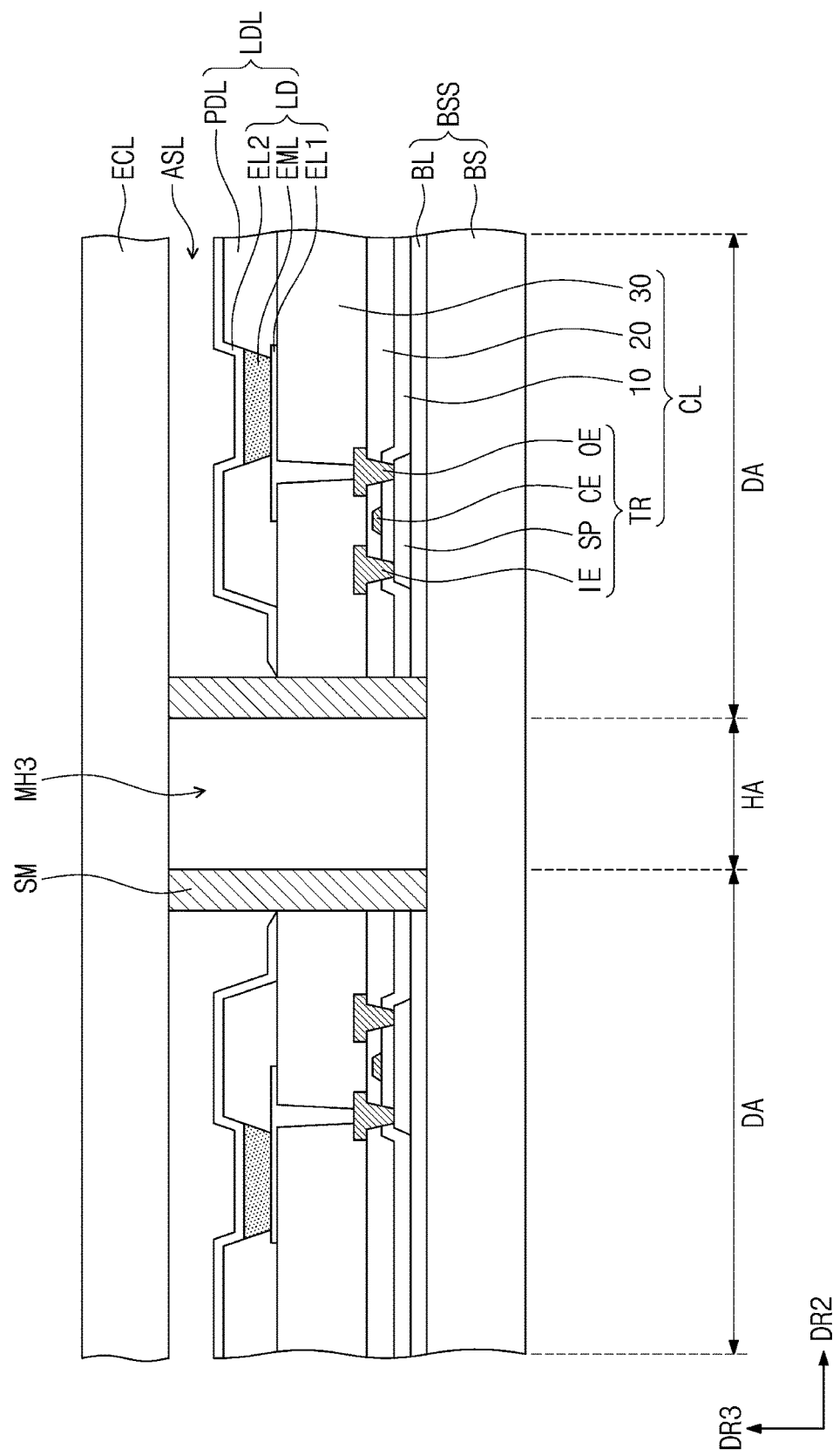

Referring to FIG. 9D, an embodiment may further include a process of arranging an encapsulation member SM along an edge of the module hole MH3. The encapsulation member SM may be arranged before the encapsulation substrate ECL is attached. The encapsulation member SM may cover the light emitting element layer LDL, the circuit layer CL, and the auxiliary layer BL, which are exposed by the module hole MH3. The encapsulation member SM may include the same material as the sealing member SLP, and be placed in the same process as that in which the sealing member SLP is placed. Referring to FIG. 9D, the module hole MH3 and the filling layer ASL may be defined by the encapsulation member SM as a boundary. The module hole MH3 may be filled with an inert gas.

Figure 9E:
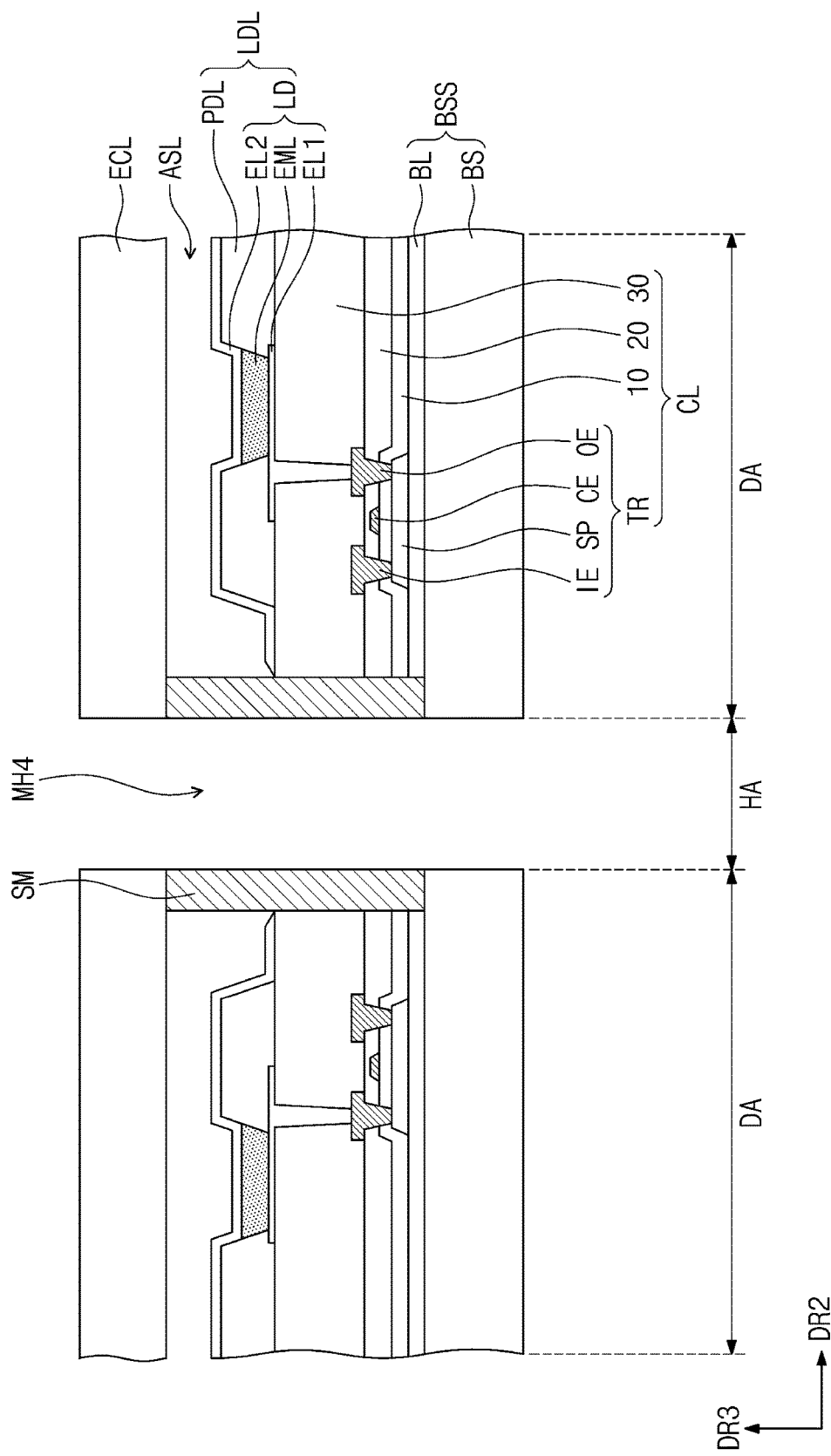

Referring to FIG. 9E, a process of irradiating the encapsulation substrate ECL and the base layer BS with a laser may be further provided. A module hole MH4 may be defined by irradiating a portion of each of the encapsulation substrate ECL and the base layer BS, which overlaps the hole area HA and is not overlapped with the encapsulation member SM, with a laser. When the module hole MH4 is defined by further removing the encapsulation substrate ECL and the base layer BS, a transmittance of the module hole MH4 may increase further than that when the encapsulation substrate ECL and the base layer BS are not removed. When the display device DD further includes an additional encapsulation member SM, the encapsulation member SM may be on an edge of the hole area HA.

Figure 10:
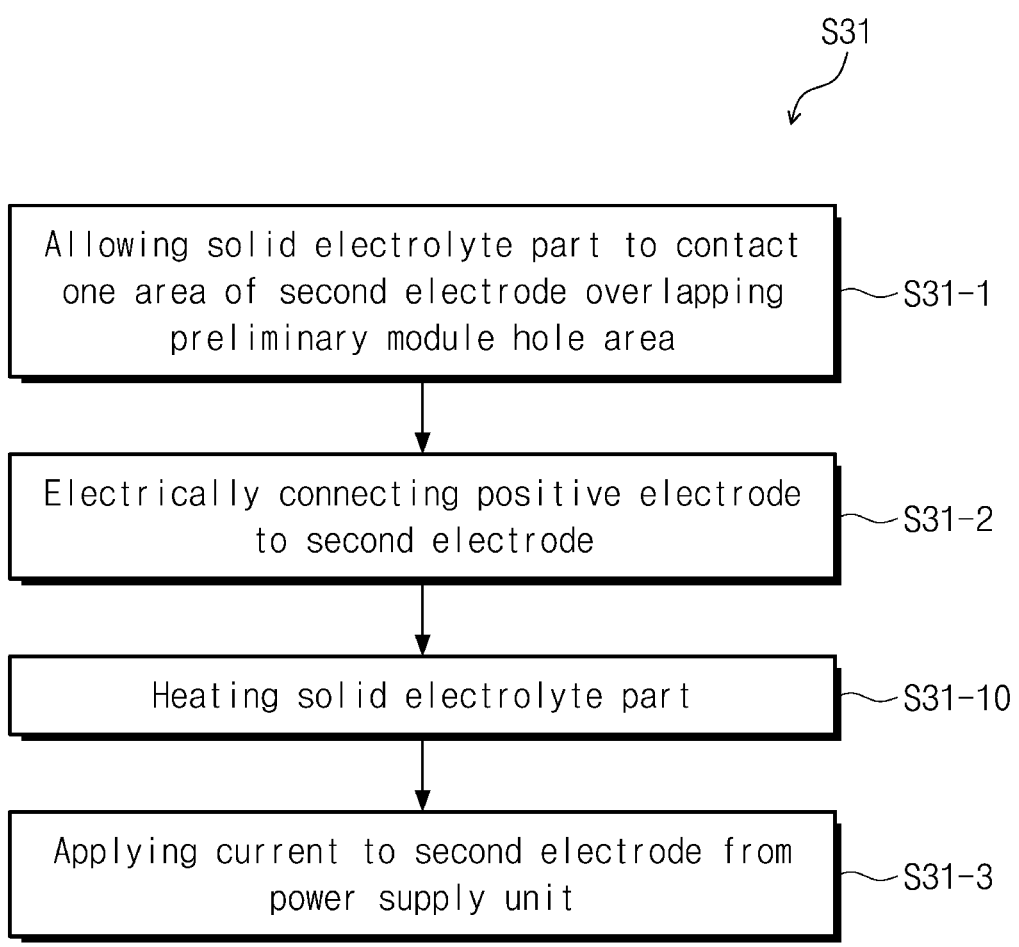
FIG. 10 is a flowchart representing a method of manufacturing a display device according to an example embodiment.
Figure 11:
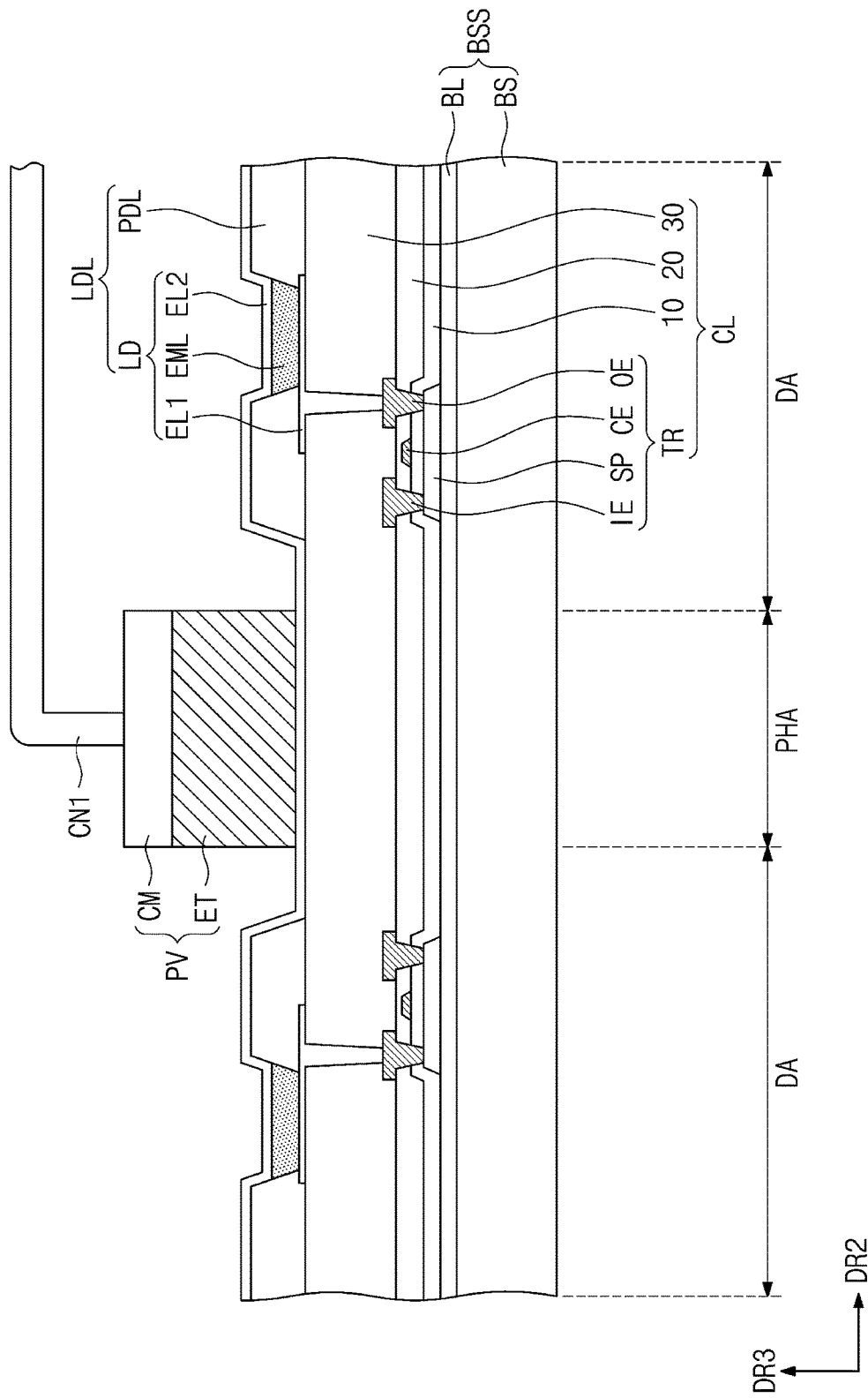
FIG. 11 is a cross-sectional view illustrating a process of heating a solid electrolyte part according to an example embodiment.

FIG. 10 is a flowchart representing the method S1 of manufacturing the display device according to an embodiment. FIG. 11 is a cross-sectional view illustrating a process of heating the solid electrolyte part ET.

Referring to FIGS. 10 and 11, in the method S31 for manufacturing the display device DD, the process S31 of electrolyzing the second electrode EL2 by using the electrolysis device may further include a process S31-10 of heating the solid electrolyte part ET. The process S31-10 of heating the solid electrolyte part ET may be a previous process of a process S31-3 of applying a current to the power supply unit PS. For example, the process S31-10 of heating the solid electrolyte part ET may be an immediately previous process of the process S31-3 of applying a current to the power supply unit PS.

Because Ag has a standard reduction potential of about 0.8V, an oxidation speed may be slow. In an embodiment, because a reaction speed may become fast when the solid electrolyte contacting the second electrode EL2 is heated, the oxidation speed of Ag may become fast. Thus, process costs may be reduced.

Although not shown, the first connection unit CN1 (refer to FIG. 8C) may include a third signal line (not shown) transmitting a heating signal transmitted from the power supply unit PS to the solid electrolyte part ET or the reduction part CM.

Figure 12A:
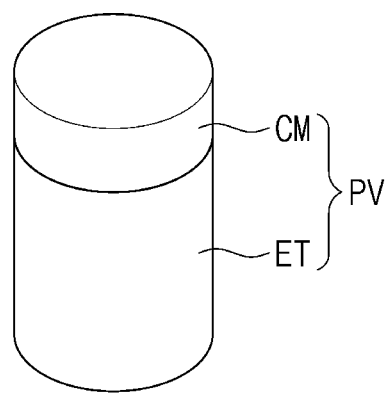
FIGS. 12A and 12B are perspective views each illustrating a probe according to an example embodiment.
Figure 12B:
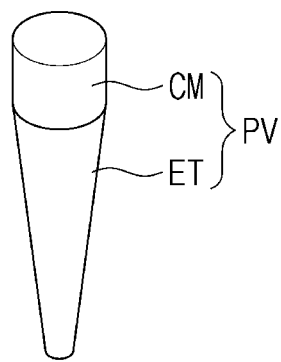

FIGS. 12A and 12B are perspective views illustrating a probe PV according to an embodiment.

Referring to FIGS. 12A and 12B, the solid electrolyte part ET may have a cylindrical or truncated cone shape. In FIG. 12A, the solid electrolyte part ET exemplarily has a cylindrical shape, and in FIG. 12B, the solid electrolyte part ET exemplarily has a circular truncated cone shape. However, the embodiment of the inventive concept is not limited to the shape of the solid electrolyte part ET. For example, the solid electrolyte part ET may have a polygonal truncated cone shape such as a triangular truncated cone shape, a rectangular truncated cone shape, and a pentagonal truncated cone shape.

When the solid electrolyte part ET according to an embodiment has a cylindrical or truncated cone shape, the second portion EL2-2 may not be delaminated as illustrated in FIG. 4. In some embodiments, when the solid electrolyte part ET has a circular truncated cone shape, the second portion EL2-2 may have a tapered shape without being delaminated as illustrated in FIG. 5. Thus, the display device DD may have a slow damage speed in a hot and humid environment, and improved durability.

In the display device DD manufactured by the method S31 for manufacturing the display device according to an embodiment, the second portion EL2-2 of the second electrode EL2 may have a thickness that gradually increases in a direction from the module hole MH to the first portion EL2-1. The second portion EL2-2 may extend from the first portion EL2-1 along the circuit layer CL while contacting the circuit layer CL. The second portion EL2-2 may have a width that gradually increases in a direction toward the circuit layer CL. Thus, the display device DD according to an embodiment may have a high durability in a hot and humid environment.

The method S31 for manufacturing the display device according to an embodiment may form the second electrode EL2 through electrolysis. Thus, as particles are not generated during a process, and the second electrode EL2 is not delaminated or does not include a burr, the display device DD having a strong durability may be manufactured.

The display device DD according to the embodiment of the inventive concept may have improved durability.

The display device DD having improved durability may be manufactured by the method for manufacturing the display device according to the embodiment of the inventive concept.

Although, the example embodiments of the present invention have been described, it is understood that the present invention should not be limited to these example embodiments but various changes and modifications can be made by one ordinary skilled in the art within the spirit and scope of the present invention as hereinafter claimed. Thus, to the maximum extent allowed by law, the scope of the example embodiments of the present invention is to be determined by the broadest permissible interpretation of the following claims and their equivalents, and shall not be restricted or limited by the foregoing detailed description.

What is claimed is:

1. A display device having a display area and a module hole area in the display area, the display device comprising:
   a base substrate;
   a circuit layer on the base substrate;
   a light emitting element layer on the circuit layer and comprising a first electrode, a second electrode on the first electrode, and a light emitting layer between the first electrode and the second electrode;
   an encapsulation layer on the light emitting element layer; and
   a module hole overlapping the module hole area and penetrating through the circuit layer and the light emitting element layer, the module hole being surrounded by the circuit layer and the light emitting element layer,
   wherein the second electrode comprises a first portion that is not overlapped with the module hole and has a first thickness and a second portion between the module hole and the first portion and having a thickness that gradually increases in a direction toward the first portion.

2. The display device of claim 1, wherein the second electrode comprises silver (Ag) and magnesium (Mg).

3. The display device of claim 2, wherein in the second portion, a portion of each of the Ag and the Mg has an amorphous structure, and the rest of the Ag and the Mg has a polycrystalline structure.

4. The display device of claim 3, wherein each of the Ag and the Mg has a polycrystalline structure in the first portion.

5. The display device of claim 2, wherein the second portion has a width that gradually increases in a direction toward the circuit layer.

6. The display device of claim 2, wherein a mole ratio between the Ag and the Mg is 95:5 to 85:15 in the first portion.

7. The display device of claim 2, wherein the second electrode further comprises at least one of Cu, Al, Pt, Pd, Au, Ni, Nd, Ir, Cr, Li, Ca, LiF/Ca, LiF/Al, Mo, and Ti.

8. The display device of claim 1, wherein the second electrode is a transflective electrode.

9. A display device having a display area and a module hole area in the display area, the display device comprising:
   a base substrate;
   a circuit layer on the base substrate;
   a light emitting element layer on the circuit layer and comprising a first electrode, a second electrode on the first electrode, and a light emitting layer between the first electrode and the second electrode;
   an encapsulation layer on the light emitting element layer;
   a module hole overlapping the module hole area and passing through the circuit layer and the light emitting element layer; and
   an electronic module overlapping the module hole on a plane, the electronic module being a camera module or an infrared sensing module,
   wherein the second electrode comprises a first portion that is not overlapped with the module hole and has a first thickness and a second portion between the module hole and the first portion and having a thickness that gradually increases in a direction toward the first portion.

10. A display device having a display area and a module hole area defined in the display area, the display device comprising:
    a base substrate;
    a circuit layer on the base substrate;
    a light emitting element layer on the circuit layer and comprising a first electrode, a second electrode on the first electrode, and a light emitting layer between the first electrode and the second electrode; and
    a module hole overlapping the module hole area and passing through the circuit layer and the light emitting element layer,
    wherein:
      the second electrode comprises Ag and Mg, the second electrode comprising a first portion that is not overlapped with the module hole and a second portion between the module hole and the first portion,
      in the first portion, each of the Ag and Mg comprises a polycrystalline structure, and
      in the second portion, a portion of each of the Ag and Mg comprises an amorphous structure and the rest of the Ag and the Mg has a polycrystalline structure.

11. The display device of claim 10, wherein the first portion has a uniform thickness, and the second portion has a thickness that gradually increases in a direction from the module hole to the first portion.

12. The display device of claim 10, wherein a mole ratio of the Ag of the first portion with respect to the entire first portion is different from that of the Ag of the second portion with respect to the entire second portion.

* * * * *